United States Patent
Tamaki et al.

(10) Patent No.: US 10,509,521 B2
(45) Date of Patent: Dec. 17, 2019

(54) INPUT DEVICE AND DISPLAY DEVICE

(71) Applicant: Japan Display Inc., Tokyo (JP)

(72) Inventors: Masaya Tamaki, Tokyo (JP); Takayuki Nakanishi, Tokyo (JP); Tatsuya Yata, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/939,986

(22) Filed: Mar. 29, 2018

(65) Prior Publication Data

US 2018/0224969 A1 Aug. 9, 2018

Related U.S. Application Data

(63) Continuation of application No. 15/081,223, filed on Mar. 25, 2016, now Pat. No. 9,965,125.

(30) Foreign Application Priority Data

Mar. 30, 2015 (JP) ................. 2015-070225

(51) Int. Cl.
- *G06F 3/044* (2006.01)
- *H01L 27/32* (2006.01)
- *G06F 3/041* (2006.01)

(52) U.S. Cl.
CPC ............ *G06F 3/044* (2013.01); *G06F 3/0416* (2013.01); *H01L 27/323* (2013.01);
(Continued)

(58) Field of Classification Search
CPC ........... G06F 3/044; G06F 2203/04101; G06F 3/0416; G06F 3/041; G06F 2203/04111; G06F 2203/04103
See application file for complete search history.

(56) References Cited

U.S. PATENT DOCUMENTS

2001/0039070 A1* 11/2001 Sekine .............. H01L 27/14685
   438/60
2005/0158526 A1* 7/2005 Ino ........................... C09D 5/22
   428/207

(Continued)

FOREIGN PATENT DOCUMENTS

| CN | 101894856 | 11/2010 |
| CN | 103842947 | 6/2014 |

(Continued)

OTHER PUBLICATIONS

Chinese Office Action dated May 3, 2018 in corresponding Chinese Application No. 201610188660.6.

(Continued)

*Primary Examiner* — Md Saiful A Siddiqui
(74) *Attorney, Agent, or Firm* — K&L Gates LLP

(57) ABSTRACT

An input device includes a first substrate, a light-emitting element, and a third electrode unit. The first substrate has first and second surfaces. The light-emitting element unit includes: a first conductive electrode unit including first conductive layers; a second conductive electrode unit including second conductive layers each having a size overlapping with the first conductive layer in planar view; and luminescent layers conducted with at least a part of the first electrode unit, each provided between the first and second electrode units and conducted with the first conductive layer and the second conductive layer overlapping with the first conductive layer in planar view. The third electrode unit is insulated from the first conductive layers and detects a change in an electric field between the first conductive layers and the third electrode unit depending on coordinates of a proximity object at a position overlapping with the first surface in planar view.

7 Claims, 14 Drawing Sheets

(52) U.S. Cl.
CPC .............. *G06F 2203/04101* (2013.01); *G06F 2203/04103* (2013.01); *G06F 2203/04111* (2013.01)

(56) References Cited

U.S. PATENT DOCUMENTS

| | | | | |
|---|---|---|---|---|
| 2008/0036746 | A1* | 2/2008 | Klinghult | G06F 3/0412 345/176 |
| 2010/0110041 | A1* | 5/2010 | Jang | G06F 3/0412 345/174 |
| 2010/0214245 | A1* | 8/2010 | Hirota | G02F 1/13338 345/173 |
| 2011/0310056 | A1* | 12/2011 | Chang | B43L 1/06 345/174 |
| 2013/0107387 | A1* | 5/2013 | Ju | H01J 11/12 359/885 |
| 2014/0152616 | A1 | 6/2014 | Kida et al. | |
| 2015/0084006 | A1* | 3/2015 | Ivanov | G06F 3/0412 257/40 |
| 2015/0324033 | A1* | 11/2015 | Kim | G06F 3/044 345/174 |

FOREIGN PATENT DOCUMENTS

| | | |
|---|---|---|
| JP | 2010-198415 | 9/2010 |
| JP | 2011-022340 | 2/2011 |
| JP | 2013-073868 | 4/2013 |
| JP | 2013-110052 | 6/2013 |
| JP | 2014-132446 | 7/2014 |

OTHER PUBLICATIONS

Japanese Office Action dated Oct. 9, 2018 in corresponding Japanese Application No. 2015-070225.
Japanese Office Action dated Oct. 1, 2019 in corresponding Japanese Application No. 2019-001481.

* cited by examiner

INPUT DEVICE AND DISPLAY DEVICE

CROSS REFERENCES TO RELATED APPLICATIONS

This application is a continuation of U.S. patent application Ser. No. 15/081,223, filed on Mar. 25, 2016, which application claims priority from Japanese Application No. 2015-070225, filed on Mar. 30, 2015, the contents of which are incorporated by reference herein in its entirety.

BACKGROUND

1. Technical Field

The present invention relates to an input device and a display device that can detect an external proximity object, and in particular to the input device and the display device that can detect an external proximity object approaching from the outside based on a change in capacitance.

2. Description of the Related Art

Japanese Patent Application Laid-open Publication No. 2010-198415 (JP-A-2010-198415) discloses an input apparatus in which an input device, or so-called a touch panel, and a lighting device, or so-called a front light, are integrated with each other.

The input apparatus described in JP-A-2010-198415 includes a light-transmissible substrate capable of transmitting light therethrough and arranged at the border between the touch panel and the front light in a manner shared by them. This configuration reduces the thickness of the input apparatus. In recent years, such input apparatuses have been required to have a further reduced thickness.

SUMMARY

According to an aspect, an input device includes a first substrate, a light-emitting element, and a third electrode unit. The first substrate has a first surface and a second surface. The light-emitting element unit includes: a first conductive electrode unit including first conductive layers; a second conductive electrode unit including second conductive layers each having a size overlapping with one of the first conductive layers in planar view; and luminescent layers electrically in contact with at least a part of the first electrode unit, each of the luminescent layers being provided between the first electrode unit and the second electrode unit and electrically in contact with one of the first conductive layers and one of the second conductive layers overlapping with the first conductive layer in planar view. The third electrode unit is insulated from the first conductive layers and detects a change in an electric field between the first conductive layers and the third electrode unit depending on coordinates of a proximity object present at a position overlapping with the first surface in planar view.

According to another aspect, a display device comprising: an input device including: a first substrate having a first surface and a second surface; a light-emitting element unit including a first electrode unit formed on the second surface and including a plurality of first conductive layers formed in one layer, a second electrode unit formed in a layer different from the layer of the first electrode unit and including a plurality of second conductive layers each having a size overlapping with one of the first conductive layers in planar view, and a plurality of luminescent layers electrically in contact with at least a part of the first electrode unit, each of the luminescent layers being provided between the first electrode unit and the second electrode unit and being electrically in contact with one of the first conductive layers and one of the second conductive layers overlapping with the first conductive layer in planar view; and a third electrode unit insulated from the first conductive layers and that detects a change in an electric field between the first conductive layers and the third electrode unit depending on coordinates of a proximity object present at a position overlapping with the first surface in planar view; and a display unit provided on the second surface of the input device and capable of displaying an image on the first surface thereof.

Additional features and advantages are described herein, and will be apparent from the following Detailed Description and the figures.

BRIEF DESCRIPTION OF THE FIGURES

FIG. 17 is a diagram for explaining voltages of the first electrode unit and the second electrode unit in the drive electrode selection period in a state where the first light-emitting element is turned on;

FIG. 19 is a diagram for explaining voltages of the first electrode unit and the second electrode unit in the drive electrode selection period in a state where the first light-emitting element is turned on;

DETAILED DESCRIPTION

Figure 1:
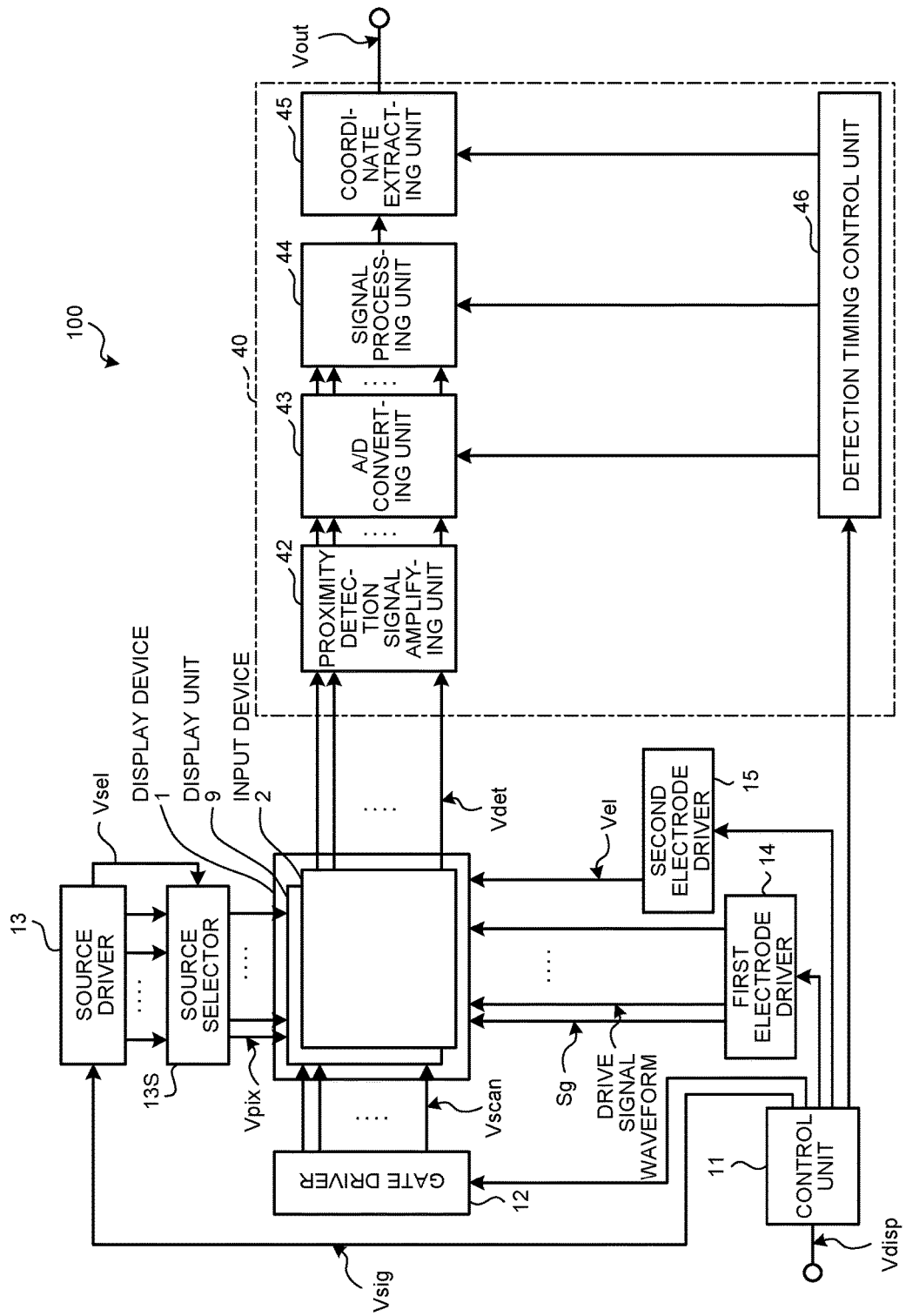
FIG. 1 is a block diagram for explaining a configuration of a display device according to a first embodiment of the present invention.

Embodiments of the present application will be described below in detail with reference to the drawings. The contents described in the embodiments are not intended to limit the present invention. Components described below include components easily conceivable by those skilled in the art and components substantially identical therewith. Furthermore, the components described below can be appropriately combined. The disclosure is given by way of example only, and various changes made without departing from the spirit of the invention and easily conceivable by those skilled in the art naturally fall within the scope of the invention. The drawings may possibly illustrate the width, the thickness, the shape, and other elements of each unit more schematically than the actual aspect to simplify the explanation. These elements, however, are given by way of example only and are not intended to limit interpretation of the invention. In the specification and the figures, components similar to those previously described with reference to a preceding figure are denoted by like reference numerals, and overlapping explanation thereof will be appropriately omitted.

First Embodiment

FIG. 1 is a block diagram for explaining a configuration of a display device according to a first embodiment of the present invention. A display system 100 includes a display device 1 with a proximity detecting function, a control unit 11, a gate driver 12, a source driver 13, a source selector 13S, a first electrode driver 14, a second electrode driver 15, and a proximity detecting unit 40. In the display device 1 with a proximity detecting function, a reflective display unit 9 and an input device 2 are stacked in a manner overlapping with each other in planar view, which will be described below. The display unit 9 serves as a reflective liquid-crystal display unit, and the input device 2 serves as a capacitive touch panel.

The display unit 9 sequentially scans each horizontal line based on a scanning signal Vscan supplied from the gate driver 12, thereby performing display, which will be described below. The control unit 11 is a circuit that supplies control signals to the gate driver 12, the source driver 13, the first electrode driver 14, the second electrode driver 15, and the proximity detecting unit 40 based on video signals Vdisp supplied from the outside, thereby performing control such that these components operate in synchronization with one another. A control device according to the present invention includes the control unit 11, the gate driver 12, the source driver 13, the first electrode driver 14, the second electrode driver 15, and the proximity detecting unit 40.

The gate driver 12 has a function to sequentially select one horizontal line to be a target of display drive in the display unit 9 based on the control signal supplied from the control unit 11.

The source driver 13 is a circuit that supplies pixel signals Vpix to pixels (sub-pixels) arranged in a matrix on the display surface of the display unit 9 based on the control signal supplied from the control unit 11. The source driver 13 generates an image signal Vsig by time-division multiplexing the pixel signals Vpix for a plurality of sub-pixels in the display unit 9 from the control signal of one horizontal line. The source driver 13 then supplies the image signal Vsig to the source selector 13S. The source driver 13 generates a switch control signal Vsel required to separate the pixel signals Vpix multiplied into the image signal Vsig. The source driver 13 then supplies the switch control signal Vsel to the source selector 13S together with the image signal Vsig. With this configuration, the source selector 13S requires a smaller number of wiring between the source driver 13 and the source selector 13S.

The first electrode driver 14 is a circuit that supplies a drive signal pulse based on a drive signal to a first electrode unit, which will be described below, of the input device 2 based on the control signal supplied from the control unit 11.

The second electrode driver 15 is a circuit that supplies a drive signal Vel to a second electrode unit, which will be described below, of the input device 2 based on the control signal supplied from the control unit 11.

The proximity detecting unit 40 is a circuit that detects whether a proximity state is created on the input device 2 based on the control signal supplied from the control unit 11 and a proximity detection signal Vdet supplied from the input device 2. If detecting the proximity state, the proximity detecting unit 40 derives the coordinates and the like of the proximity detection area. The proximity detecting unit 40 includes a proximity detection signal amplifying unit 42, an analog/digital (A/D) converting unit 43, a signal processing unit 44, a coordinate extracting unit 45, and a detection timing control unit 46.

The proximity detection signal amplifying unit 42 amplifies the proximity detection signal Vdet supplied from the input device 2. The proximity detection signal amplifying unit 42 may include an analog low-pass filter that removes high-frequency components (noise components) included in the proximity detection signal Vdet and extracts and outputs the component of the proximity detection signal Vdet.

Basic Principle of Capacitive Proximity Detection

Figure 2:
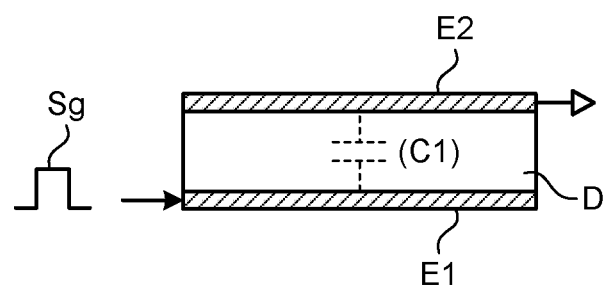
FIG. 2 is a diagram for explaining the basic principle of a capacitive proximity detection technology and illustrates a state where no external proximity object is in contact with or in proximity to an input device.
Figure 3:
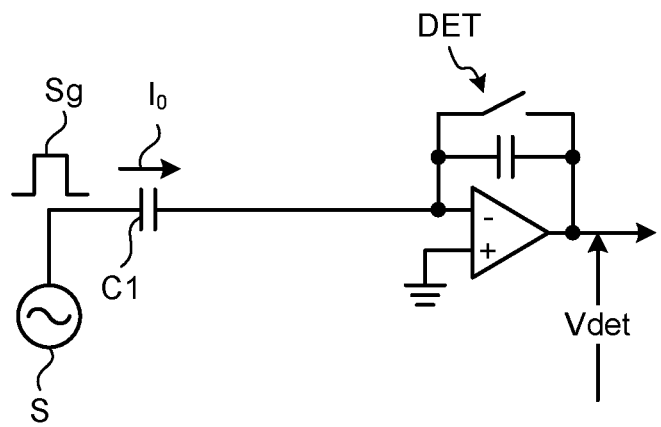
FIG. 3 is a diagram for explaining an example of an equivalent circuit in the state where no external proximity object is in contact with or in proximity to the input device illustrated in FIG. 2.
Figure 4:
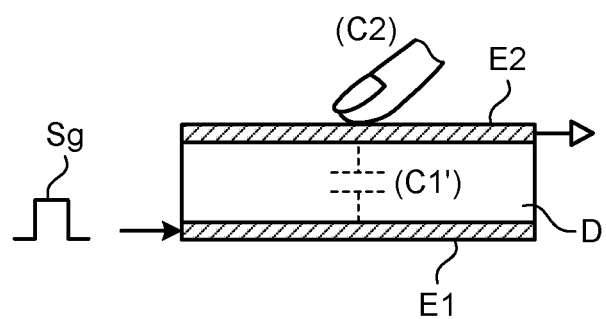
FIG. 4 is a diagram for explaining the basic principle of the capacitive proximity detection technology and illustrates a state where an external proximity object is in contact with or in proximity to the input device.
Figure 5:
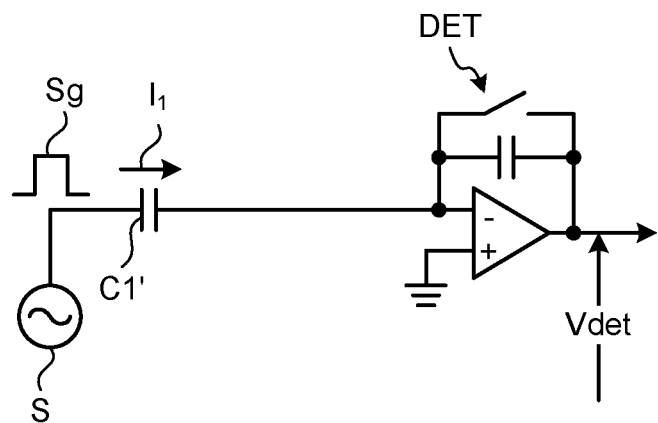
FIG. 5 is a diagram for explaining an example of the equivalent circuit in the state where the external proximity object is in contact with or in proximity to the input device illustrated in FIG. 4.
Figure 6:
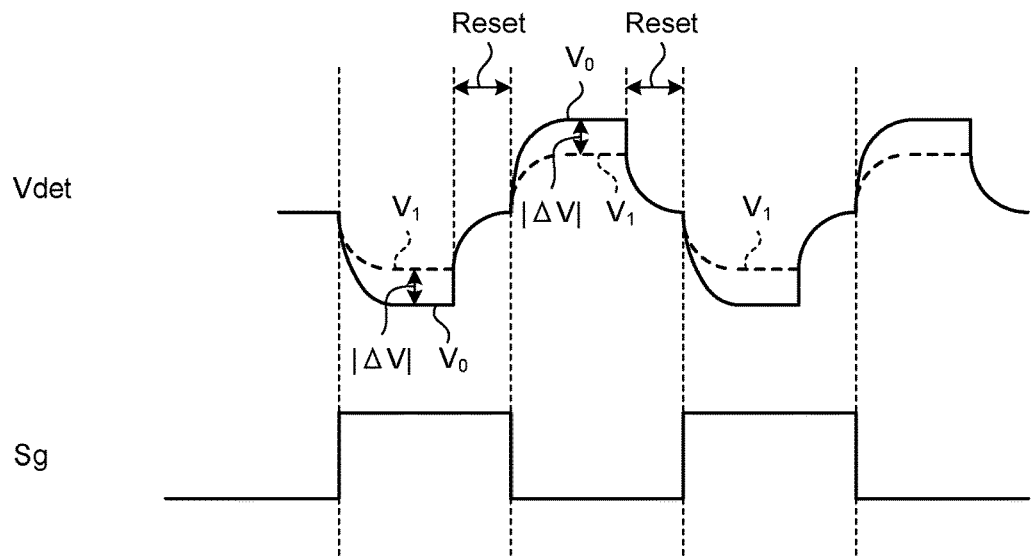
FIG. 6 is a diagram illustrating an example of waveforms of a drive signal and a proximity detection signal.

The input device 2 operates based on the basic principle of capacitive proximity detection and outputs the proximity detection signal Vdet. The following describes the basic principle of proximity detection in the input device 2 with reference to FIGS. 1 to 6. FIG. 2 is a diagram for explaining the basic principle of a capacitive proximity detection technology and illustrates a state where no external proximity object is in contact with or in proximity to the input device 2. FIG. 3 is a diagram for explaining an example of an equivalent circuit in the state where no external proximity object is in contact with or in proximity to the input device 2 illustrated in FIG. 2. FIG. 4 is a diagram for explaining the basic principle of the capacitive proximity detection technology and illustrates a state where an external proximity object is in contact with or in proximity to the input device 2. FIG. 5 is a diagram for explaining an example of the equivalent circuit in the state where the external proximity object is in contact with or in proximity to the input device 2 illustrated in FIG. 4. FIG. 6 is a diagram illustrating an example of waveforms of a drive signal and a proximity detection signal.

As illustrated in FIG. 2, for example, a capacitive element C1 includes a pair of electrodes, i.e., a drive electrode E1 and a proximity detection electrode E2, arranged facing each other with a dielectric D interposed therebetween. As illustrated in FIG. 3, one end of the capacitive element C1 is coupled to an alternating-current (AC) signal source (drive signal source) S, whereas the other end thereof is coupled to a voltage detector (proximity detecting unit) DET. The voltage detector DET is an integration circuit included in the proximity detection signal amplifying unit 42 illustrated in FIG. 1, for example.

When the AC signal source S applies a drive signal pulse Sg, which is an AC rectangular wave, at a predetermined frequency (e.g., several kilohertz to several hundred kilohertz) to the drive electrode E1 (one end of the capacitive element C1), an output waveform (proximity detection signal Vdet) is generated via the voltage detector DET coupled to the proximity detection electrode E2 (the other end of the capacitive element C1).

In a non-proximity state (including a non-contact state) where no external proximity object (e.g., a finger or a stylus pen) is in proximity to (or in contact with) the input device 2, an electric current $I_0$ depending on the capacitance value of the capacitive element C1 flows in association with charge and discharge of the capacitive element C1 as illustrated in FIGS. 2 and 3. As illustrated in FIG. 6, the voltage detector DET converts fluctuations in the electric current $I_0$ depending on the drive signal pulse Sg into fluctuations in the voltage (waveform $V_0$ indicated by the solid line).

On the other hand, in a proximity state (including a contact state) where an external proximity object is in proximity to (or in contact with) the input device 2, capacitance C2 generated by the external proximity object is in contact with or in proximity to the proximity detection electrode E2 as illustrated in FIG. 4. The presence of the capacitance C2 blocks capacitance of a fringe between the drive electrode E1 and the proximity detection electrode E2, thereby providing a capacitive element C having a capacitance value smaller than that of the capacitive element C1. In the equivalent circuit illustrated in FIG. 5, an electric current $I_1$ flows through the capacitive element C1'. As illustrated in FIG. 6, the voltage detector DET converts fluctuations in the electric current depending on the drive signal pulse Sg into fluctuations in the voltage (waveform $V_1$ indicated by the dotted line). In this case, the waveform $V_1$ has amplitude smaller than that of the waveform $V_0$. As a result, an absolute value |ΔV| of the voltage difference between the waveform $V_0$ and the waveform $V_1$ varies depending on the influence of an object, such as the external proximity object, approaching the input device 2 from the outside. To accurately detect the absolute value |ΔV| of the voltage difference between the waveform $V_0$ and the waveform $V_1$, the voltage detector DET preferably performs the operation with a period Reset to reset charge and discharge of a capacitor based on the frequency of the drive signal pulse Sg by switching in the circuit.

The input device 2 illustrated in FIG. 1 sequentially scans each detection block in response to the drive signal supplied from the first electrode driver 14, thereby performing proximity detection.

The input device 2 outputs the proximity detection signal Vdet for each detection block from a plurality of proximity detection electrodes, which will be described below, via the voltage detector DET illustrated in FIG. 3 or FIG. 5. The input device 2 thus supplies the proximity detection signal Vdet to the proximity detection signal amplifying unit 42 of the proximity detecting unit 40. The proximity detection signal amplifying unit 42 amplifies the proximity detection signal Vdet and supplies it to the A/D converting unit 43.

The A/D converting unit 43 is a circuit that samples an analog signal output from the proximity detection signal amplifying unit 42 at timing synchronized with the drive signal, thereby converting the analog signal into a digital signal.

The signal processing unit 44 includes a digital filter that reduces frequency components (noise components) other than the frequency at which the drive signal is sampled in the output signal from the A/D converting unit 43. The signal processing unit 44 is a logic circuit that detects whether a touch is made on the input device 2 based on the output signal from the A/D converting unit 43. The signal processing unit 44 performs processing for extracting only the voltage difference caused by the external proximity object. The signal of the voltage difference caused by the external proximity object corresponds to the absolute value |ΔV| of the difference between the waveform $V_0$ and the waveform $V_1$. The signal processing unit 44 may perform an arithmetic operation for averaging the absolute values |ΔV| per detection block, thereby calculating the average value of the absolute values |ΔV|. The signal processing unit 44 thus can reduce the influence of noise. The signal processing unit 44 compares the signal of the detected voltage difference caused by the external proximity object with a predetermined threshold voltage. If the voltage difference is equal to or larger than the threshold voltage, the signal processing unit 44 determines that the external proximity object is in the proximity state. On the other hand, if the voltage difference is determined to be smaller than the threshold voltage as a result of comparison between the detected digital voltage and the predetermined threshold voltage, the signal processing unit 44 determines that the external proximity object is in the non-proximity state. The proximity detecting unit 40 thus performs proximity detection.

The coordinate extracting unit 45 is a logic circuit that derives, when a proximity state is detected by the signal processing unit 44, the coordinate position at which the proximity state is created in the plane of the detection area. The detection timing control unit 46 performs control such that the A/D converting unit 43, the signal processing unit 44, and the coordinate extracting unit 45 operate in synchronization with one another. The coordinate extracting unit 45 outputs the coordinates of the proximity object as an output signal Vout.

Figure 7:
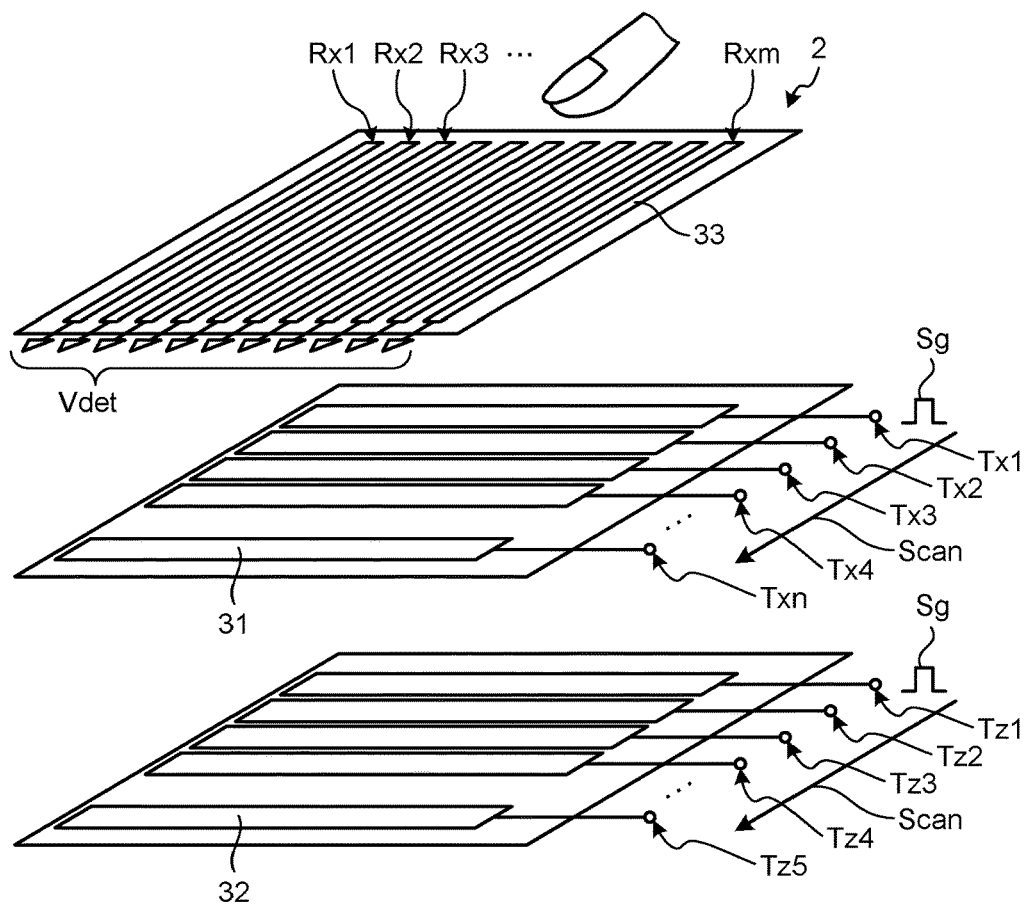
FIG. 7 is a perspective view illustrating an example of drive electrodes and proximity detection electrodes of an input device according to the first embodiment.

FIG. 7 is a perspective view illustrating an example of the drive electrodes and the proximity detection electrodes of the input device according to the first embodiment. The input device 2 includes a first electrode unit 31, a second electrode unit 32, and a third electrode unit 33 insulated from the first electrode unit 31 and the second electrode unit 32. The first electrode unit 31 has a plurality of stripe electrode patterns extending in a predetermined extending direction of a conductor pattern. The electrode patterns serve as drive electrodes Tx1, Tx2, Tx3, . . . , Txn (hereinafter, which may be referred to as drive electrodes Tx) from which the drive signal pulse Sg is applied.

The second electrode unit 32 has a plurality of stripe electrode patterns extending in a predetermined extending direction of a conductor pattern. The electrode patterns serve as drive electrodes Tz1, Tz2, Tz3, . . . , Tzn (hereinafter, which may be referred to as drive electrodes Tz) from which the drive signal pulse Sg is applied. The drive electrodes Tz correspond one-to-one to the drive electrodes Tx facing them. A drive electrode Tz facing a drive electrode Tx to which the drive signal pulse Sg is applied is synchronously supplied with the same drive signal pulse Sg.

The third electrode unit 33 has a plurality of stripe electrode patterns extending in a direction intersecting with the extending direction of the first electrode unit 31. The electrode patterns serve as proximity detection electrodes Rx1, Rx2, Rx3, . . . , Rxm (hereinafter, which may be referred to as proximity detection electrodes Rx) that output the proximity detection signal Vdet. The electrode patterns of the proximity detection electrodes Rx are coupled to respective input terminals of the proximity detection signal amplifying unit 42 of the proximity detecting unit 40.

In the input device 2 according to the first embodiment illustrated in FIG. 7, the proximity detection electrodes Rx face the drive electrodes Tx. The proximity detection electrodes Rx do not necessarily face the drive electrodes Tx and may be provided in the same layer as that of the drive electrodes Tx. The proximity detection electrodes Rx or the drive electrodes Tx do not necessarily have a stripe shape, i.e., a shape divided into a plurality of portions and may have a comb shape, for example. Alternatively, any shape can be employed for the proximity detection electrodes Rx or the first electrode unit 31 (drive electrode block), as long as being divided into a plurality of portions. In this case, the shape of the slits dividing the first electrode unit 31 may be a straight line or a curve.

The drive electrode E1 illustrated in FIG. 2 corresponds to each of the drive electrodes Tx illustrated in FIG. 7. The proximity detection electrode E2 illustrated in FIG. 2 corresponds to each of the proximity detection electrodes Rx illustrated in FIG. 7. With this configuration, capacitance corresponding to the capacitance value of the capacitive element C1 illustrated in FIG. 2 is generated at the intersections at which the drive electrodes Tx intersect with the proximity detection electrodes Rx in planar view illustrated in FIG. 7.

Figure 8:
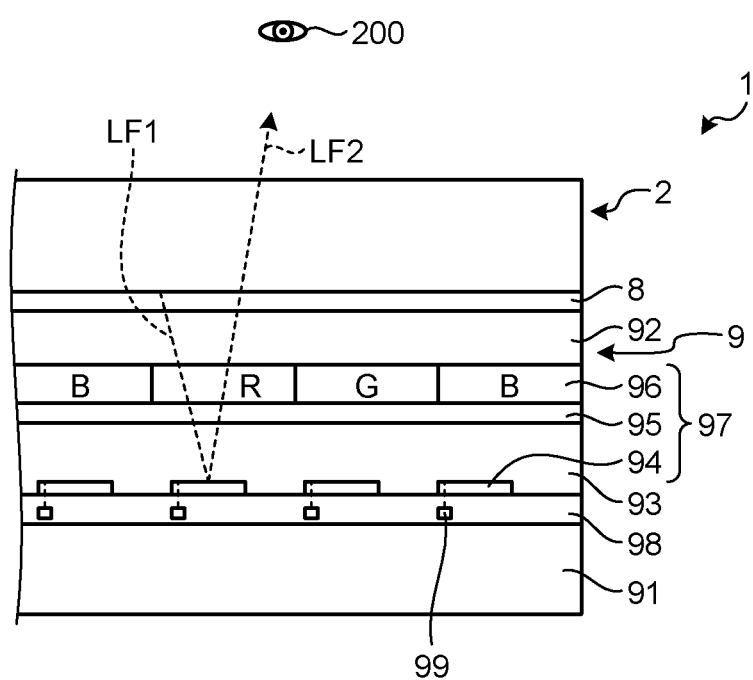
FIG. 8 is a sectional view schematically illustrating the structure of a display device with a proximity detecting function according to the first embodiment.

The following describes the structure of the display device 1 with a proximity detecting function. FIG. 8 is a sectional view schematically illustrating the structure of the display device with a proximity detecting function according to the first embodiment. The display unit 9 according to the first embodiment is a reflective image display panel. The display unit 9 may be a transflective image display panel and simply needs to be a display device that displays an image by reflecting incident light entering from the observer 200 side. As illustrated in FIG. 8, the display unit 9 includes an array substrate 91 and a counter substrate 92 facing each other. A liquid-crystal layer 93 in which liquid-crystal elements are sealed is provided between the array substrate 91 and the counter substrate 92.

The array substrate 91 is a transparent light-transmissive substrate, such as a glass substrate. The array substrate 91 includes a plurality of pixel electrodes 94 on the surface of an insulation layer 98 on the liquid-crystal layer 93 side. The pixel electrodes 94 are coupled to signal lines via respective switching elements 99. The pixel signals Vpix described above are applied to the pixel electrodes 94. The pixel electrodes 94 are made of a material having metallic luster, such as aluminum and silver, and have light reflectivity. With this structure, the pixel electrodes 94 reflect external light or light from the input device 2.

The counter substrate 92 is a transparent light-transmissive substrate, such as a glass substrate. The counter substrate 92 includes a counter electrode 95 and color filters 96 on the surface on the liquid-crystal layer 93 side. More specifically, the counter electrode 95 is provided on the surface of the color filters 96 on the liquid-crystal layer 93 side.

The counter electrode 95 is made of a transparent light-transmissive conductive material, such as indium tin oxide (ITO) and indium zinc oxide (IZO). The counter electrode 95 is supplied with a common potential common to the pixels. When a voltage generated by an image output signal is applied between the pixel electrodes 94 and the counter electrode 95 facing each other, the pixel electrodes 94 and the counter electrode 95 generate an electric field in the liquid-crystal layer 93. The electric filed generated in the liquid-crystal layer 93 causes the liquid-crystal elements to twist and changes the birefringence, thereby adjusting the amount of light from the display unit 9 in each sub-pixel 97. While the display unit 9 is what is called a vertical-electric-field display unit, it may be a lateral-electric-field display unit that generates an electric field in a direction parallel to the display surface.

The color filter 96 of any one of a first color (e.g., red R), a second color (e.g., green G), and a third color (e.g., blue B) is provided to each sub-pixel 97 in a manner correspondingly to the pixel electrode 94. The pixel electrode 94, the counter electrode 95, and the color filter 96 of each color constitute the sub-pixel 97.

The input device 2 can output light toward the display unit 9 in an LF1 direction. The input device 2 is provided above the surface of the counter substrate 92 on the side opposite to the liquid-crystal layer 93. The display unit 9 uses the input device 2 as a front light, which will be described below, and reflects, in an LF2 direction, the light that has entered in the LF1 direction, thereby displaying an image. The pixel electrode 94 reflects, in the LF2 direction, the light that has entered in the LF1 direction from the surface on the observer 200 side (surface on which an image is displayed), for example. The input device 2 is bonded to the counter substrate 92 with an optical adhesive layer 8. The optical adhesive layer 8 is preferably made of a material having a light-scattering function. The light output from the input device 2 in the LF1 direction is scattered by the optical adhesive layer 8. With this configuration, the pixel electrode 94 is likely to be uniformly irradiated with the light from the input device 2. A polarizing plate may be further provided at the position of the optical adhesive layer 8.

Figure 9:
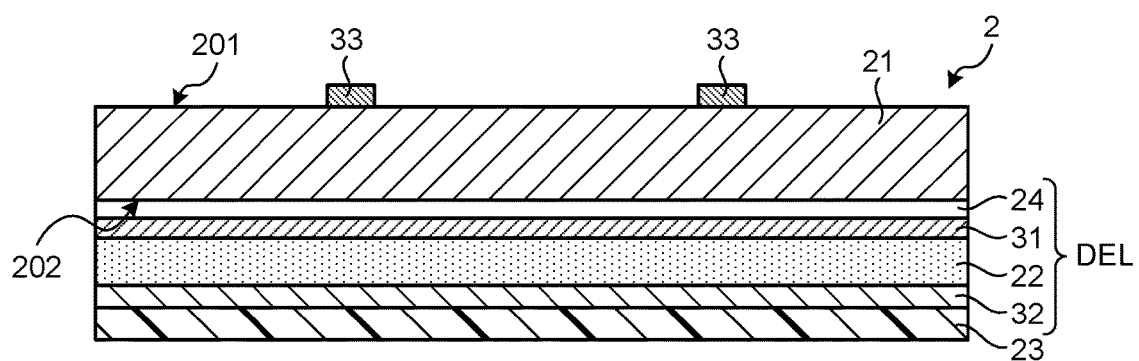
FIG. 9 is a sectional view schematically illustrating the structure of the input device according to the first embodiment.
Figure 10:
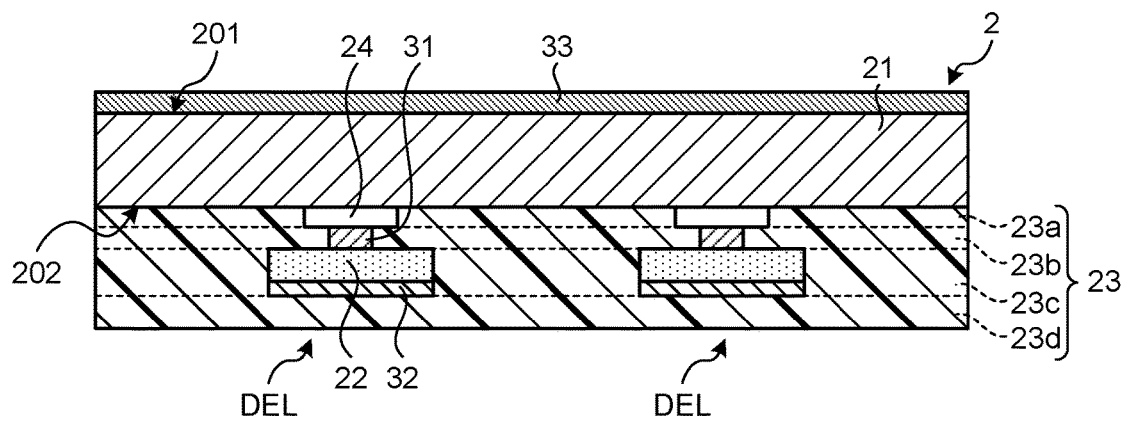
FIG. 10 is another sectional view schematically illustrating the structure of the input device according to the first embodiment.
Figure 11:
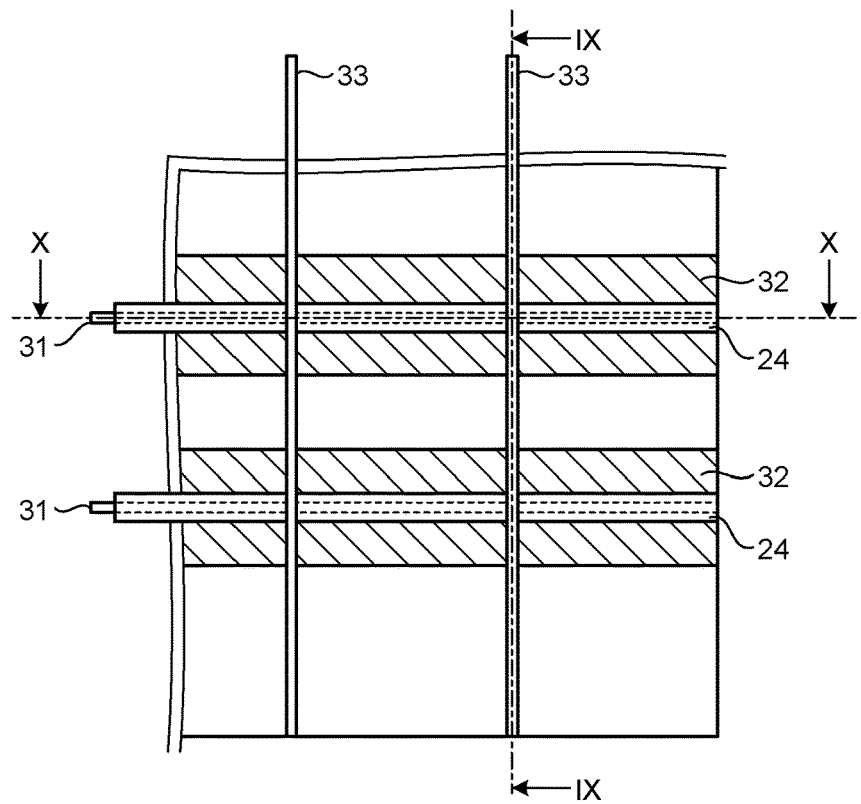
FIG. 11 is a diagram for explaining the positional relation in planar view among a first electrode unit, a second electrode unit, and a third electrode unit of the input device according to the first embodiment.

FIG. 9 is a sectional view schematically illustrating the structure of the input device according to the first embodiment. FIG. 10 is another sectional view schematically illustrating the structure of the input device according to the first embodiment. FIG. 11 is a view for explaining the positional relation in planar view among the first electrode unit, the second electrode unit, and the third electrode unit of the input device according to the first embodiment. The section illustrated in FIG. 9 is a section along line X-X in FIG. 11, whereas the section illustrated in FIG. 10 is a section along line IX-IX in FIG. 11. As illustrated in FIGS. 9 and 10, the input device 2 includes a first substrate 21, the first electrode unit 31, the second electrode unit 32, a luminescent layer 22, the third electrode unit 33, and a first light-blocking unit 24. The second electrode unit 32 is covered with an insulating protective layer 23. The insulating protective layer 23 is not necessarily provided. The first substrate 21 is a light-transmissive substrate, such as a glass substrate, having a first surface 201 and a second surface 202. In the input device 2, the first surface 201 in FIGS. 9 and 10 is provided on the observer 200 side illustrated in FIG. 8, and the second surface 202 is provided on the display unit 9 side.

The first electrode unit 31 includes a plurality of first conductive layers formed in one layer on the second surface 202 side of the first substrate 21. The first conductive layers have a shape continuously extending in one direction in planar view and are in contact with the luminescent layer 22 along the shape of the first conductive layers. The first conductive layers of the first electrode unit 31 are made of a transparent light-transmissive conductive material or a conductive metal material, such as ITO and IZO. The first conductive layers of the first electrode unit 31 can reflect light emitted from the luminescent layer 22 when they are made of a metal material having metallic luster, such as aluminum (Al), silver (Ag), and chromium (Cr), and an alloy containing these metals.

The first light-blocking unit 24 is arranged between the first substrate 21 and the first electrode unit 31. The first light-blocking unit 24 is provided along the shape of the first conductive layer of the first electrode unit 31. The first light-blocking unit 24 has an area larger than that of the first conductive layer of the first electrode unit 31. The first light-blocking unit 24 can cover the whole area of the first conductive layer of the first electrode unit 31 viewed in a direction perpendicular to the first surface 201 of the first substrate 21.

The first light-blocking unit 24 may be made of any desired material as long as it has a light-blocking property. The first light-blocking unit 24 is preferably made of a metal material having metallic luster, such as Al, Ag, and Cr, and an alloy containing these metals to reflect light emitted from the luminescent layer 22. A first light-emitting element unit DEL thus includes the first light-blocking unit 24 provided closer to the first surface 201 of the first substrate 21 than the luminescent layer 22, thereby preventing light from leaking toward the first surface 201 of the first substrate 21.

The luminescent layer 22 has a size overlapping with one of the first conductive layers in planar view. As illustrated in FIGS. 9 and 10, the luminescent layer 22 is provided between the first electrode unit 31 and the second electrode unit 32. The luminescent layer 22 is electrically in contact with the first conductive layer of the first electrode unit 31. The luminescent layer 22 is an organic luminescent layer and contains an organic material. The luminescent layer 22 includes a hole injection layer, a hole transport layer, an organic layer, an electron transport layer, and an electron injection layer, which are not illustrated.

The second electrode unit 32 is second conductive layers formed in a layer different from that of the first electrode unit 31. Each second conductive layer has a size overlapping with one of the first conductive layers in planar view. The second conductive layer of the second electrode unit 32 is electrically in contact with the entire surface of the luminescent layer 22. The second conductive layers of the second electrode unit 32 are made of a transparent light-transmissive conductive material, such as ITO and IZO.

The first light-emitting element unit DEL includes the first electrode unit 31, the luminescent layer 22, and the second electrode unit 32. The luminescent layer 22 emits light by a forward-bias voltage being applied to the first electrode unit 31 and the second electrode unit 32. When the voltage is applied, the luminescent layer 22 in the first light-emitting element unit DEL can emit light along the shape of the first conductive layers of the first electrode unit 31. As a result, light-emitting bands are generated in a manner continuously extending in one direction in planar view. The input device 2 thus functions as a front light that can output light to the display unit 9 illustrated in FIG. 8.

Assuming that the first electrode unit 31 serves as a cathode, and the second electrode unit 32 serves as an anode, the first conductive layers of the first electrode unit 31 may be made only of a metal, such as Al and Ag, and the second conductive layers of the second electrode unit 32 may be made of ITO. When the first electrode unit 31 serves as an anode, the first conductive layers of the first electrode unit 31 may be made of Al with ITO sputtered thereon. In a case where the second electrode unit 32 serves as a cathode, the second conductive layers of the second electrode unit 32 may be made of IZO.

The third electrode unit 33 is provided on the first surface 201 of the first substrate 21 and is insulated from the first conductive layers of the first electrode unit 31. The third electrode unit 33 includes a plurality of third conductive layers formed in one layer different from that of the first conductive layers of the first electrode unit 31. The first surface 201 on which the third electrode unit 33 is formed is a reference plane (coordinate input reference plane) serving as a reference for input coordinates of the proximity object.

As described above, the first electrode unit 31 and the second electrode unit 32 respectively correspond to the drive electrodes Tx and the drive electrodes Tz from which the drive signal pulse Sg is applied, whereas the third electrode unit 33 corresponds to the proximity detection electrodes Rx (refer to FIG. 7). When the input device 2 performs a proximity detection operation, the third electrode unit 33 can output, to the proximity detecting unit 40 (refer to FIG. 1), a change in the electric field between the first electrode unit 31 and the third electrode unit 33 depending on the coordinates of the proximity object present at a position overlapping with the first surface 201 of the first substrate 21 in planar view.

To manufacture the input device 2, the first substrate 21 is prepared, and the first light-blocking unit 24 is patterned on the second surface 202 of the first substrate 21. Gaps between adjacent first light-blocking units 24 are planarized by an insulation layer 23a. Subsequently, the first conductive layer of the first electrode unit 31 is patterned on the first light-blocking unit 24. Gaps between adjacent first conductive layers of the first electrode unit 31 are planarized by an insulation layer 23b. Subsequently, the luminescent layer 22 and the adjacent second conductive layers of the second electrode unit 32 are formed on the first conductive layers of the first electrode unit 31 and the insulation layer 23b. Gaps between adjacent luminescent layers 22 and adjacent second conductive layers of the second electrode unit 32 are planarized by an insulation layer 23c. Subsequently, an insulation layer 23d made of an insulator is formed in the input device 2. As described above, the protective layer 23 includes the insulation layer 23a, the insulation layer 23b, the insulation layer 23c, and the insulation layer 23d. The insulation layers 23a, 23b, 23c, and 23d are light-transmissive insulators, such as alumina ($Al_2O_3$). The insulation layers 23a, 23b, 23c, and 23d may be made of different materials as long as they are insulators. Subsequently, the third electrode unit 33 is formed on the first surface 201 of the first substrate 21 in the input device 2. As described above, the input device 2 according to the first embodiment can be manufactured with a smaller number of etching processes, thereby reducing manufacturing cost.

First Modification of the First Embodiment

Figure 12:
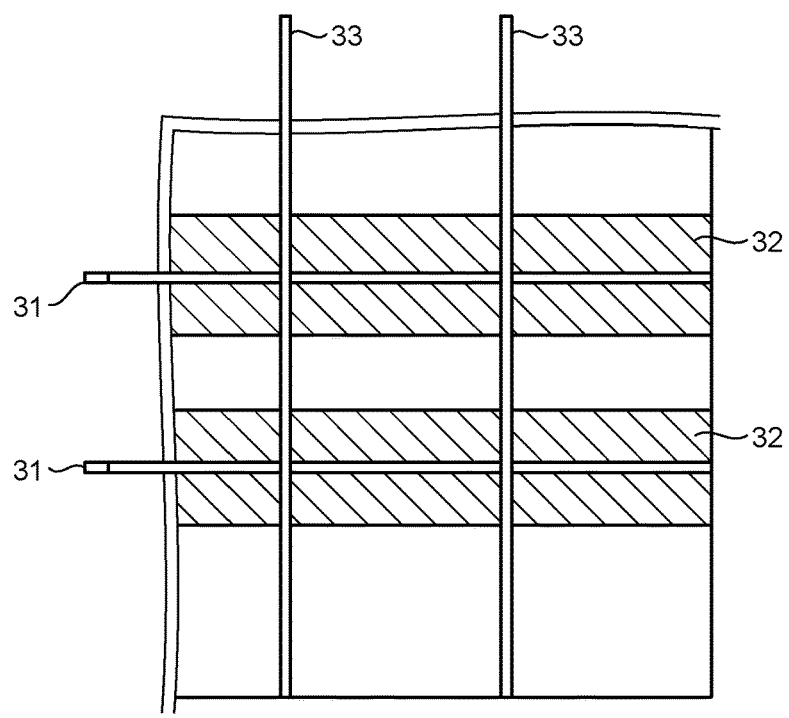
FIG. 12 is a diagram for explaining the positional relation in planar view among the first electrode unit, the second electrode unit, and the third electrode unit of the input device according to a first modification of the first embodiment.

The following describes the input device 2 according to a first modification of the first embodiment. FIG. 12 is a diagram for explaining the positional relation in planar view among the first electrode unit, the second electrode unit, and the third electrode unit of the input device according to the first modification of the first embodiment. Components identical with those described in the first embodiment are denoted by like reference numerals, and overlapping explanation thereof will be omitted.

As illustrated in FIG. 12, the input device 2 according to the first modification of the first embodiment is different from the input device 2 according to the first embodiment in that it does not include the first light-blocking unit 24.

Second Modification of the First Embodiment

Figure 13:
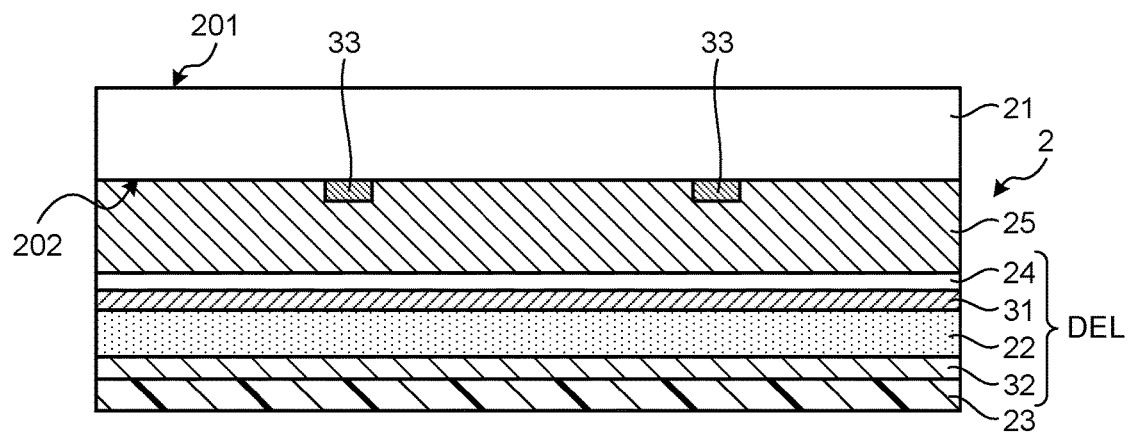
FIG. 13 is a sectional view schematically illustrating the structure of the input device according to a second modification of the first embodiment.

The following describes the input device 2 according to a second modification of the first embodiment. FIG. 13 is a sectional view schematically illustrating the structure of the input device according to the second modification of the first embodiment. The section illustrated in FIG. 13 is a section of the modification along line X-X in FIG. 11. In the input device according to the second modification of the first embodiment illustrated in FIG. 13, the positional relation in planar view among the first electrode unit, the second electrode unit, and the third electrode unit is the same as that illustrated in FIG. 11. Components identical with those described in the first embodiment are denoted by like reference numerals, and overlapping explanation thereof will be omitted.

The input device 2 according to the second modification of the first embodiment includes the first substrate 21, an insulation layer 25, the first electrode unit 31, the second electrode unit 32, the luminescent layer 22, the third electrode unit 33, and the first light-blocking unit 24. The third electrode unit 33 according to the second modification of the first embodiment is provided on the second surface 202 of the first substrate 21 and is insulated from the first conductive layers of the first electrode unit 31 by the insulation layer 25. The first surface 201 of the first substrate 21 on the side opposite to the second surface 202 on which the third electrode unit 33 is formed is a reference plane (coordinate input reference plane) serving as a reference for input coordinates of the proximity object. As illustrated in FIG. 13, the first electrode unit 31, the second electrode unit 32, and the third electrode unit 33 are provided on the second surface 202 side of the first substrate 21.

As described above, the first electrode unit 31 and the second electrode unit 32 respectively correspond to the drive electrodes Tx and the drive electrodes Tz from which the drive signal pulse Sg is applied, whereas the third electrode unit 33 corresponds to the proximity detection electrodes Rx (refer to FIG. 7). When the input device 2 performs a proximity detection operation, the third electrode unit 33 can output, to the proximity detecting unit 40 (refer to FIG. 1), a change in the electric field between the first electrode unit 31 and the third electrode unit 33 depending on the coordinates of the proximity object present at a position overlapping with the first surface 201 of the first substrate 21 in planar view.

Third Modification of the First Embodiment

Figure 14:
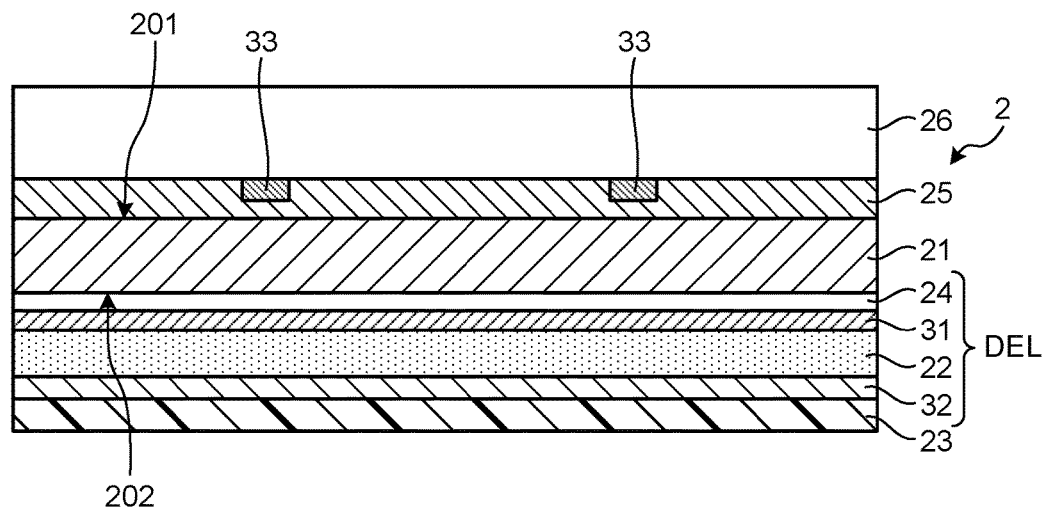
FIG. 14 is a sectional view schematically illustrating the structure of the input device according to a third modification of the first embodiment.

The following describes the input device 2 according to a third modification of the first embodiment. FIG. 14 is a sectional view schematically illustrating the structure of the input device according to the third modification of the first embodiment. In the input device according to the third modification of the first embodiment illustrated in FIG. 14, the positional relation in planar view among the first electrode unit, the second electrode unit, and the third electrode unit is the same as that illustrated in FIG. 11. Components identical with those described in the first embodiment and the modifications thereof are denoted by like reference numerals, and overlapping explanation thereof will be omitted.

The input device 2 includes a cover substrate 26, the insulation layer 25, the first substrate 21, the first electrode unit 31, the second electrode unit 32, the luminescent layer 22, the third electrode unit 33, and the first light-blocking unit 24. The cover substrate 26 is a light-transmissive substrate, such as a glass substrate. The third electrode unit 33 according to the third modification of the first embodiment is provided on the surface of the cover substrate 26 facing the first substrate 21 and on the second surface 201 side of the first substrate 21. The cover substrate 26 and the first substrate 21 are laminated with the insulation layer 25 interposed therebetween and are insulated from each other. The first surface 201 of the first substrate 21 according to the third modification of the first embodiment is a reference plane (coordinate input reference plane) serving as a reference for input coordinates of the proximity object. The surface of the cover substrate 26 on the side opposite to the side provided with the third electrode unit 33 is substantially parallel to the first surface 201 of the first substrate 21.

As described above, the first electrode unit 31 corresponds to the drive electrodes Tx from which the drive signal pulse Sg is applied, whereas the third electrode unit 33 corresponds to the proximity detection electrodes Rx (refer to FIG. 7). When the input device 2 performs a proximity detection operation, the third electrode unit 33 can output, to the proximity detecting unit 40 (refer to FIG. 1), a change in the electric field between the first electrode unit 31 and the third electrode unit 33 depending on the coordinates of the proximity object present at a position overlapping with the first surface 201 of the first substrate 21 in planar view.

As described above, the first electrode unit 31 and the second electrode unit 32 according to the first embodiment and the modifications thereof function as electrodes of the first light-emitting element unit DEL and also respectively function as the drive electrodes Tx and the drive electrodes Tz of the input device 2. This configuration can reduce the thickness of the input device 2.

Drive Control

The following describes drive control of the input device 2 according to the first embodiment and the modifications thereof with reference to FIGS. 1, 7, and 15 to 19. When the input device 2 performs a proximity detection operation, the first electrode driver 14 illustrated in FIG. 1 performs driving to sequentially scan the drive electrodes Tx illustrated in FIG. 7 in a time-division manner. As a result, the drive electrodes Tx of the first electrode unit 31 are sequentially selected in a scanning direction Scan. The input device 2 then outputs the proximity detection signal Vdet from the proximity detection electrodes Rx. The first electrode driver 14 of the input device 2 may perform driving to sequentially scan each detection block including a plurality of drive electrodes Tx illustrated in FIG. 7 in a time-division manner.

The first electrode unit 31 functions as electrodes of the first light-emitting element unit DEL and also functions as the drive electrodes Tx of the input device 2. Therefore, the first light-emitting element unit DEL may emit light even if not necessary, by the drive signal pulse Sg being applied to the drive electrodes Tx of the first electrode unit 31. To address this, the input device 2 according to the first embodiment and the modifications thereof employs a driving method for suppressing unintended emission of light from the first light-emitting element unit DEL even when the drive signal pulse Sg is applied to the drive electrodes Tx of the first electrode unit 31.

Figure 15:
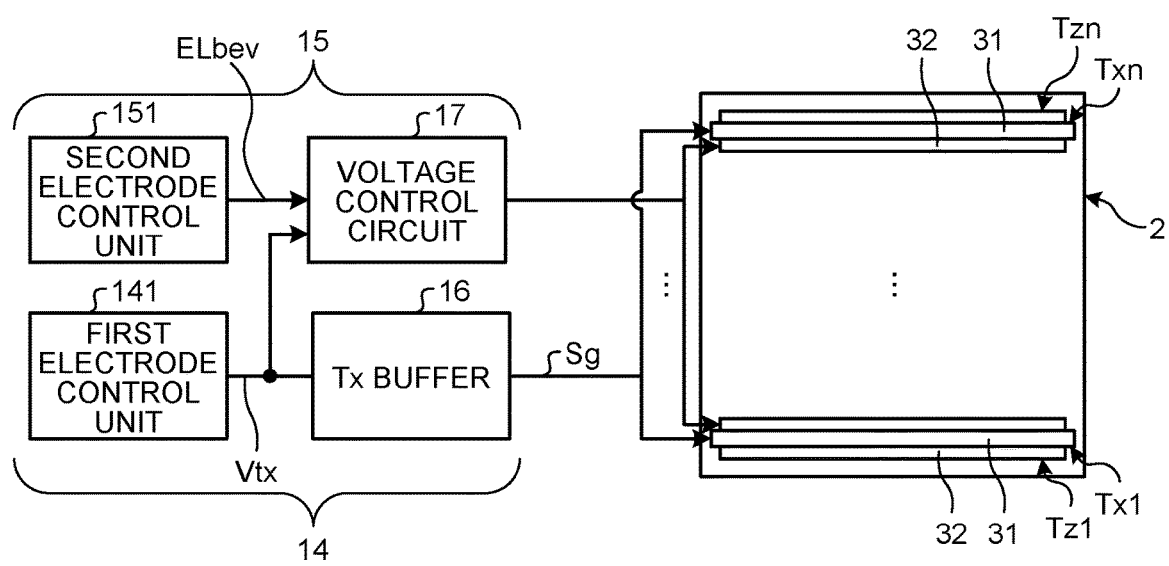
FIG. 15 is a diagram for explaining a first drive electrode driver and a second drive electrode driver according to the first embodiment.

FIG. 15 is a diagram for explaining a first drive electrode driver and a second drive electrode driver according to the first embodiment. The first electrode driver 14 includes a first electrode control unit 141 and a Tx buffer 16. The first electrode control unit 141 generates a drive signal Vtx based on the control signal supplied from the control unit 11 and supplies it to the Tx buffer 16. Based on the drive signal Vtx, the Tx buffer 16 supplies the amplified drive signal pulse Sg to the drive electrode Txn (a part of the first electrode unit 31) sequentially selected in the scanning direction Scan.

The second electrode driver 15 includes a second electrode control unit 151 and a voltage control circuit 17. The second electrode control unit 151 transmits a control signal ELbev for supplying electric power at a certain voltage to the voltage control circuit 17. The voltage control circuit 17 controls the voltage supplied to the second electrode unit 32 of the input device 2 based on the control signal supplied from the control unit 11. Similarly to the Tx buffer 16, the voltage control circuit 17 supplies the amplified drive signal pulse Sg to the drive electrode Tzn (a part of the second electrode unit 32) sequentially selected in the scanning direction Scan based on the drive signal Vtx.

Figure 16:
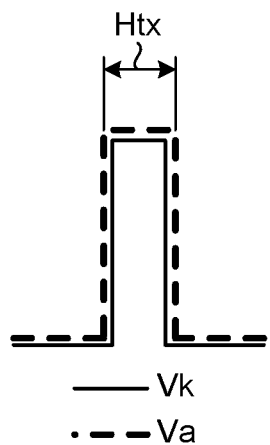
FIG. 16 is a diagram for explaining voltages of the first electrode unit and the second electrode unit in a drive electrode selection period in a state where a first light-emitting element is turned off.
Figure 17:
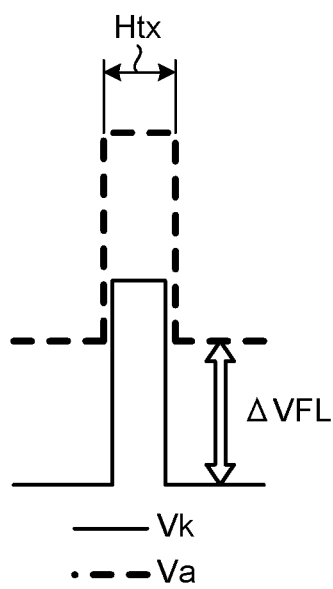

FIG. 16 is a diagram for explaining voltages of the first electrode unit and the second electrode unit in a drive electrode selection period in a state where a first light-emitting element is turned off. FIG. 17 is a diagram for explaining voltages of the first electrode unit and the second electrode unit in the drive electrode selection period in a state where the first light-emitting element is turned on. In FIGS. 16 and 17, the first electrode unit 31 serves as a cathode of the first light-emitting element unit DEL, whereas the second electrode unit 32 serves as an anode of the first light-emitting element unit DEL.

To turn off the first light-emitting element unit DEL, the voltage control circuit 17 makes a voltage Va of the second electrode unit 32 closer to a voltage Vk of the first electrode unit 31, thereby preventing the voltage difference between the voltage Vk of the first electrode unit 31 and the voltage Va of the second electrode unit 32 from reaching a forward light-emitting drive voltage $\Delta$VFL. In this state, the first electrode driver 14 applies the drive signal pulse Sg to the first electrode unit 31 as illustrated in FIG. 16. The second electrode driver 15 applies the drive signal pulse Sg to a part of the second electrode unit 32 overlapping in planar view with a part of the first electrode unit 31 to which the first electrode driver 14 has applied the drive signal pulse Sg. The rising direction of the drive signal pulse Sg applied by the first electrode driver 14 is the same as that applied by the second electrode driver 15. Even when the drive signal pulse Sg is applied in a drive selection period Htx, this configuration prevents the potential difference between the first electrode unit 31 and the second electrode unit 32 from exceeding the light-emitting drive voltage $\Delta$VFL at which the first light-emitting element unit DEL is turned on, thereby suppressing emission of light from the first light-emitting element unit DEL. As a result, when the first electrode driver 14 and the second electrode driver 15 perform driving to sequentially scan the drive electrodes Tx and the drive electrodes Tz, respectively, in a time-division manner, it is possible to suppress emission of light from the first light-emitting element unit DEL caused by either of the drive signal pulses Sg.

To turn on the first light-emitting element unit DEL, the voltage control circuit 17 performs control to make the difference between the voltage Vk of the first electrode unit 31 and the voltage Va of the second electrode unit 32 closer to the forward-bias light-emitting drive voltage $\Delta$VFL. As illustrated in FIG. 17, the voltage control circuit 17 applies a forward-bias voltage of equal to or larger than the light-emitting drive voltage $\Delta$VFL between the first electrode unit 31 and the second electrode unit 32.

As illustrated in FIG. 17, the first electrode driver 14 applies the drive signal pulse Sg to the first electrode unit 31. The second electrode driver 15 applies the drive signal pulse Sg to a part of the second electrode unit 32 overlapping in planar view with a part of the first electrode unit 31 to which the first electrode driver 14 has applied the drive signal pulse Sg. Even when the drive signal pulse Sg is applied in the drive selection period Htx, this configuration makes the potential difference between the first electrode unit 31 and the second electrode unit 32 equal to or larger than the light-emitting drive voltage $\Delta$VFL. Even when the drive signal pulse Sg is applied, the first light-emitting element unit DEL continues to emit light. The lighting amount of the first light-emitting element unit DEL varies depending on the voltage Va of the second electrode unit 32 controlled by the voltage control circuit 17 based on an instruction from the control unit 11.

Figure 18:
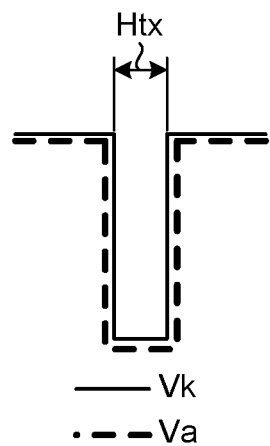
FIG. 18 is a diagram for explaining voltages of the first electrode unit and the second electrode unit in the drive electrode selection period in a state where the first light-emitting element is turned off.
Figure 19:
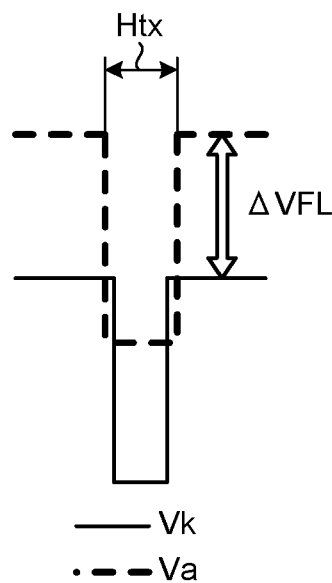

The first electrode unit 31 may serve as an anode of the first light-emitting element unit DEL, and the second electrode unit 32 may serve as a cathode of the first light-emitting element unit DEL. FIG. 18 is a diagram for explaining voltages of the first electrode unit and the second electrode unit in the drive electrode selection period in a state where the first light-emitting element is turned off. FIG. 19 is a diagram for explaining voltages of the first electrode unit and the second electrode unit in the drive electrode selection period in a state where the first light-emitting element is turned on. In FIGS. 18 and 19, the first electrode unit 31 serves as an anode of the first light-emitting element unit DEL, whereas the second electrode unit 32 serves as a cathode of the first light-emitting element unit DEL.

To turn off the first light-emitting element unit DEL, the voltage control circuit 17 makes the voltage Vk of the second electrode unit 32 closer to the voltage Va of the first electrode unit 31, thereby preventing the voltage difference between the voltage Va of the first electrode unit 31 and the voltage Vk of the second electrode unit 32 from reaching the forward light-emitting drive voltage $\Delta$VFL. In this state, the first electrode driver 14 applies the drive signal pulse Sg between the first electrode unit 31 and the second electrode unit 32 as illustrated in FIG. 18. The second electrode driver 15 applies the drive signal pulse Sg to a part of the second electrode unit 32 overlapping in planar view with a part of the first electrode unit 31 to which the first electrode driver 14 has applied the drive signal pulse Sg. Even when the drive signal pulse Sg is applied in the drive selection period Htx, this configuration prevents the potential difference between the first electrode unit 31 and the second electrode unit 32 from exceeding the light-emitting drive voltage ΔVFL at which the first light-emitting element unit DEL is turned on, thereby suppressing emission of light from the first light-emitting element unit DEL. As a result, the first electrode driver 14 and the second electrode driver 15 perform driving to sequentially scan the drive electrodes Tx and the drive electrodes Tz, respectively, in a time-division manner, thereby suppressing emission of light from the first light-emitting element unit DEL caused by either of the drive signal pulses Sg.

To turn on the first light-emitting element unit DEL, the voltage control circuit 17 performs control to make the difference between the voltage Va of the first electrode unit 31 and the voltage Vk of the second electrode unit 32 closer to the forward-bias light-emitting drive voltage ΔVFL. As illustrated in FIG. 19, the voltage control circuit 17 applies a forward-bias voltage of equal to or larger than the light-emitting drive voltage ΔVFL between the first electrode unit 31 and the second electrode unit 32.

As illustrated in FIG. 19, the first electrode driver 14 applies the drive signal pulse Sg to the first electrode unit 31. The second electrode driver 15 applies the drive signal pulse Sg to a part of the second electrode unit 32 overlapping in planar view with a part of the first electrode unit 31 to which the first electrode driver 14 applies the drive signal pulse Sg. Even when the drive signal pulse Sg is applied in the drive selection period Htx, this configuration makes the potential difference between the first electrode unit 31 and the second electrode unit 32 equal to or larger than the light-emitting drive voltage ΔVFL. Even when the drive signal pulse Sg is applied, the first light-emitting element unit DEL continues to emit light. The lighting amount of the first light-emitting element unit DEL varies depending on the voltage Vk of the second electrode unit 32 controlled by the voltage control circuit 17 based on an instruction from the control unit 11.

As described above, in the input device 2 according to the first embodiment and the modifications thereof, the first electrode unit 31 includes a plurality of first conductive layers formed in one layer, and the second electrode unit 32 includes a plurality of second conductive layers each having a size overlapping with one of the first conductive layers of the first electrode unit 31 in planar view. The drive signal pulses Sg rising in the same direction are applied to one of the first conductive layers of the first electrode unit 31 and one of the second conductive layers of the second electrode unit 32 overlapping with each other in planar view.

Specifically, the input device 2 according to the first embodiment and the modifications thereof includes the first electrode driver 14, the second electrode driver 15, and the proximity detecting unit 40. The first electrode driver 14 supplies a voltage to the first electrode unit 31. The second electrode driver 15 supplies a voltage to the second electrode unit 32. The proximity detecting unit 40 detects a change in the electric field between the first electrode unit 31 and the third electrode unit 33 depending on the coordinates of the proximity object present at a position overlapping with the first surface 201 of the first substrate 21 in planar view as the proximity detection signal Vdet in response to the drive signal pulse Sg. As described above, the first electrode driver 14 and the second electrode driver 15 scan, in a time-division manner, a part of the first electrode unit 31 and a part of the second electrode unit 32 overlapping with each other in planar view as the drive electrode Tx and the drive electrode Tz, respectively, to supply the drive signal pulse Sg.

In a case where the input device 2 according to the first embodiment and the modifications thereof does not function as a front light, the second electrode driver 15 applies no forward-bias voltage between the first electrode unit 31 and the second electrode unit 32, thereby applying no light-emitting drive voltage ΔVFL. In this case, even when the drive signal pulse Sg is applied to the first electrode unit 31 and the second electrode unit 32 in the input device 2, emission of light from the first light-emitting element unit DEL is suppressed.

On the other hand, in a case where the input device 2 according to the first embodiment and the modifications thereof function as a front light, the second electrode driver 15 applies a forward-bias voltage between the first electrode unit 31 and the second electrode unit 32, thereby applying the light-emitting drive voltage ΔVFL. As a result, the first light-emitting element unit DEL emits light. The second electrode driver 15 controls the voltage value equal to or larger than the light-emitting drive voltage ΔVFL, thereby controlling the lighting amount of the first light-emitting element unit DEL. In this case, even when the drive signal pulse Sg is applied to the first electrode unit 31 and the second electrode unit 32 in the input device 2, the first light-emitting element unit DEL continues to emit light.

Second Embodiment

Figure 20:
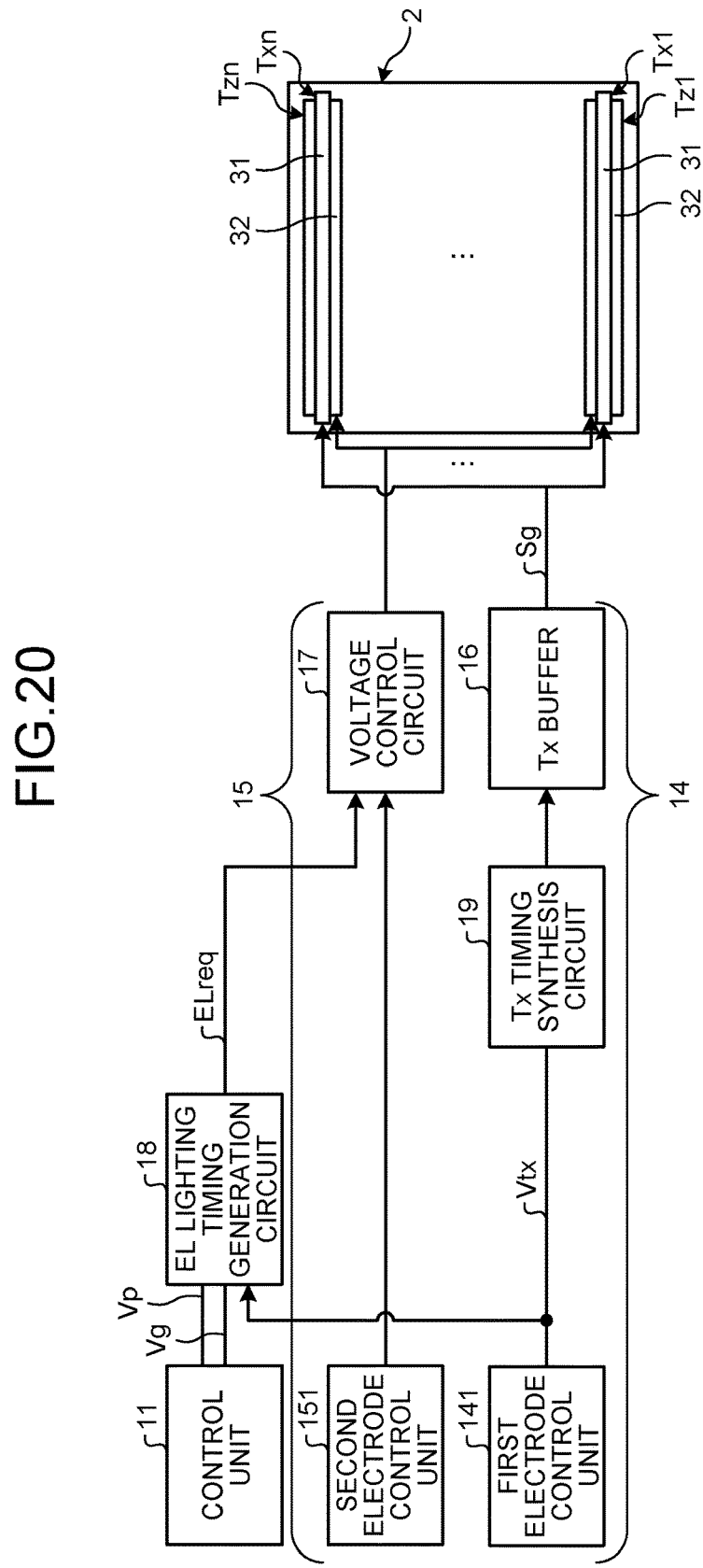
FIG. 20 is a diagram for explaining the first drive electrode driver and the second drive electrode driver according to a second embodiment of the present invention.

The following describes drive control of the input device 2 according to a second embodiment of the present invention with reference to FIGS. 1, 6, 7, 20, and 21. In the following description, the input device 2 according to the second embodiment is explained using the input device 2 according to the first embodiment as an example. The technology according to the second embodiment is also applicable to any of the input devices described in the modifications of the first embodiment. FIG. 20 is a diagram for explaining the first drive electrode driver and the second drive electrode driver according to the second embodiment. The first electrode unit 31 serves as a cathode of the first light-emitting element unit DEL, whereas the second electrode unit 32 serves as an anode of the first light-emitting element unit DEL. Components identical with those described in the first embodiment and the modifications thereof are denoted by like reference numerals, and overlapping explanation thereof will be omitted.

As illustrated in FIG. 20, the first electrode driver 14 according to the second embodiment includes the first electrode control unit 141, a Tx timing synthesis circuit 19, and the Tx buffer 16. The first electrode control unit 141 generates the drive signal Vtx based on the control signal supplied from the control unit 11 and supplies it to the Tx timing synthesis circuit 19 and an EL lighting timing generation circuit 18. The control unit 11 transmits a display synchronization signal Vp and a lighting amount signal Vg for lighting the display unit 9 to the EL lighting timing generation circuit 18. The display synchronization signal Vp is a request signal for causing the first light-emitting element unit DEL to emit light in synchronization with update of display. Based on the display synchronization signal Vp, the EL lighting timing generation circuit 18 generates a pulse signal ELreq of a lighting period corresponding to the lighting amount signal Vg. The EL lighting timing generation circuit 18 generates the pulse signal ELreq of the lighting period having a pulse width corresponding to the lighting amount of the first light-emitting element unit DEL by setting a lighting period to be a high level (H) and a non-lighting period to be a low level (L), for example. The EL lighting timing generation circuit 18 then supplies the pulse signal ELreq to the Tx timing synthesis circuit 19. When the drive signal Vtx is supplied to the EL lighting timing generation circuit 18, the pulse of the drive signal Vtx is superimposed on the pulse signal ELreq of the lighting period.

The second electrode driver 15 includes the second electrode control unit 151 and the voltage control circuit 17. The second electrode control unit 151 supplies electric power at a constant voltage to the voltage control circuit 17. The voltage control circuit 17 controls the voltage supplied to the second electrode unit 32 of the input device 2 based on the control signal supplied from the control unit 11.

To turn off the first light-emitting element unit DEL, the voltage control circuit 17 according to the second embodiment makes the voltage Va of the second electrode unit 32 closer to the voltage Vk of the first electrode unit 31 (refer to FIG. 16). Even if the first light-emitting element unit DEL is turned on, the voltage control circuit 17 maintains the voltage without any change.

Figure 21:
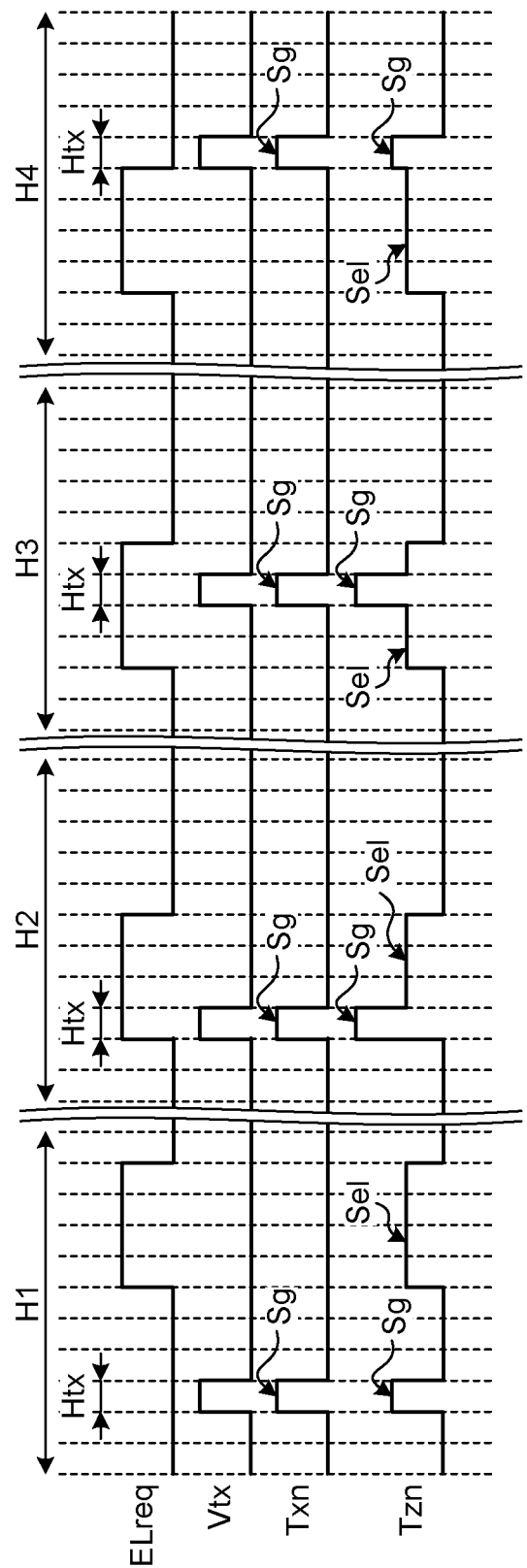
FIG. 21 is a timing chart of drive control according to the second embodiment.

FIG. 21 is a timing chart of drive control according to the second embodiment. As illustrated in FIG. 21, in a first period H1, the drive signal Vtx transmitted from the first electrode control unit 141 does not coincide with the pulse signal ELreq of the lighting period. In the first period H1, the first electrode driver 14 applies the drive signal pulse Sg to a part of the first conductive layers (drive electrode Txn) of the first electrode unit 31 in response to the drive signal Vtx. The second electrode driver 15 applies the drive signal pulse Sg to the second conductive layer (drive electrode Tzn) of the second electrode unit 32 overlapping with the drive electrode Txn in planar view in response to the drive signal Vtx. In this case, even when the drive signal pulse Sg is applied in the drive selection period Htx, this configuration prevents the potential difference between the first electrode unit 31 and the second electrode unit 32 from exceeding the light-emitting drive voltage $\Delta$VFL at which the first light-emitting element unit DEL is turned on, thereby suppressing emission of light from the first light-emitting element unit DEL. As a result, the first electrode driver 14 and the second electrode driver 15 perform driving to sequentially scan the drive electrodes Tx and the drive electrodes Tz, respectively, in a time-division manner, thereby suppressing emission of light from the first light-emitting element unit DEL caused by either of the drive signal pulses Sg.

In the first period H1, a lighting pulse Sel is supplied to the drive electrode Tzn (a part of the first electrode unit 31) of the input device 2 based on the pulse signal ELreq of the lighting period. The lighting pulse Sel makes a voltage difference between the first electrode unit 31 and the second electrode unit 32. When the voltage difference reaches the forward-bias light-emitting drive voltage $\Delta$VFL, the first light-emitting element unit DEL emits light. The lighting pulse Sel may be composed of a plurality of pulses, and the lighting amount of the first light-emitting element unit DEL may be controlled by pulse-width modulation.

As described above, when receiving the display synchronization signal Vp, the EL lighting timing generation circuit 18 generates the pulse signal ELreq of the lighting period. If the drive signal Vtx coincides with the request signal for the lighting pulse Sel (display synchronization signal Vp), a rise of the drive signal Vtx transmitted from the first electrode control unit 141 coincides with a rise of the pulse signal ELreq of the lighting period in a second period H2 illustrated in FIG. 21. In the second period H2, the lighting pulse Sel on which the drive signal pulse Sg is superimposed is applied to a part of the second conductive layers (drive electrode Tzn) of the second electrode unit 32 based on the signal obtained by superimposing the drive signal Vtx on the pulse signal ELreq of the lighting period. In other words, even if the drive signal pulse Sg is superimposed, the forward-bias light-emitting drive voltage $\Delta$VFL is applied between the first electrode unit 31 and the second electrode unit 32 by the lighting pulse Sel. As a result, the first light-emitting element unit DEL emits light.

In the second period H2, the first electrode driver 14 applies the drive signal pulse Sg to a part of the first conductive layers (drive electrode Txn) of the first electrode unit 31 in response to the drive signal Vtx. The second electrode driver 15 applies the drive signal pulse Sg to the second conductive layer (drive electrode Tzn) of the second electrode unit 32 overlapping with the drive electrode Txn in planar view in response to the drive signal Vtx. Even if the drive signal pulse Sg is applied in the drive selection period Htx, the first light-emitting element unit DEL can emit light when the potential difference between the first electrode unit 31 and the second electrode unit 32 reaches the light-emitting drive voltage $\Delta$VFL.

As illustrated in FIG. 21, in a third period H3, the drive signal Vtx transmitted from the first electrode control unit 141 coincides with the pulse signal ELreq of the lighting period. In the third period H3, the drive selection period Htx coincides with the required lighting period. In the third period H3, the lighting pulse Sel on which the drive signal pulse Sg is superimposed is applied to a part of the second conductive layers (drive electrode Tzn) of the second electrode unit 32 based on the signal obtained by superimposing the drive signal Vtx on the pulse signal ELreq of the lighting period. Even if the drive signal pulse Sg is superimposed, the forward-bias light-emitting drive voltage $\Delta$VFL is applied between the first electrode unit 31 and the second electrode unit 32 by the lighting pulse Sel. As a result, the first light-emitting element unit DEL emits light.

In the third period H3, the first electrode driver 14 applies the drive signal pulse Sg to a part of the first conductive layers (drive electrode Txn) of the first electrode unit 31 in response to the drive signal Vtx. The second electrode driver 15 applies the drive signal pulse Sg to the second conductive layer (drive electrode Tzn) of the second electrode unit 32 overlapping with the drive electrode Txn in planar view in response to the drive signal Vtx. Even if the drive signal pulse Sg is applied in the drive selection period Htx, the first light-emitting element unit DEL can emit light when the potential difference between the first electrode unit 31 and the second electrode unit 32 reaches the light-emitting drive voltage $\Delta$VFL.

As illustrated in FIG. 21, in a fourth period H4, a rise of the drive signal Vtx transmitted from the first electrode control unit 141 coincides with a fall of the pulse signal ELreq of the lighting period. If the drive signal Vtx is superimposed on the pulse signal ELreq of the lighting period, the drive signal Vtx does not coincide with the pulse signal ELreq of the lighting period. When the lighting pulse Sel amplified and generated from the pulse signal ELreq of the lighting period is applied to a part of the second conductive layers (drive electrode Tzn) of the second electrode unit 32 of the input device 2, the first light-emitting element unit DEL emits light. In other words, the forward-bias light-emitting drive voltage $\Delta$VFL is applied between the first electrode unit 31 and the second electrode unit 32 by the lighting pulse Sel. As a result, the first light-emitting element unit DEL emits light.

In the fourth period H4, the first electrode driver 14 applies the drive signal pulse Sg to a part of the first conductive layers (drive electrode Txn) of the first electrode unit 31 in response to the drive signal Vtx. The second electrode driver 15 applies the drive signal pulse Sg to the second conductive layer (drive electrode Tzn) of the second electrode unit 32 overlapping with the drive electrode Txn in planar view in response to the drive signal Vtx. Even if the drive signal pulse Sg is applied in the drive selection period Htx, the potential difference between the first electrode unit 31 and the second electrode unit 32 is smaller than the light-emitting drive voltage ΔVFL at which the first light-emitting element unit DEL emits light. As a result, it is possible to suppress emission of light from the first light-emitting element unit DEL.

Modification of the Second Embodiment

Figure 22:
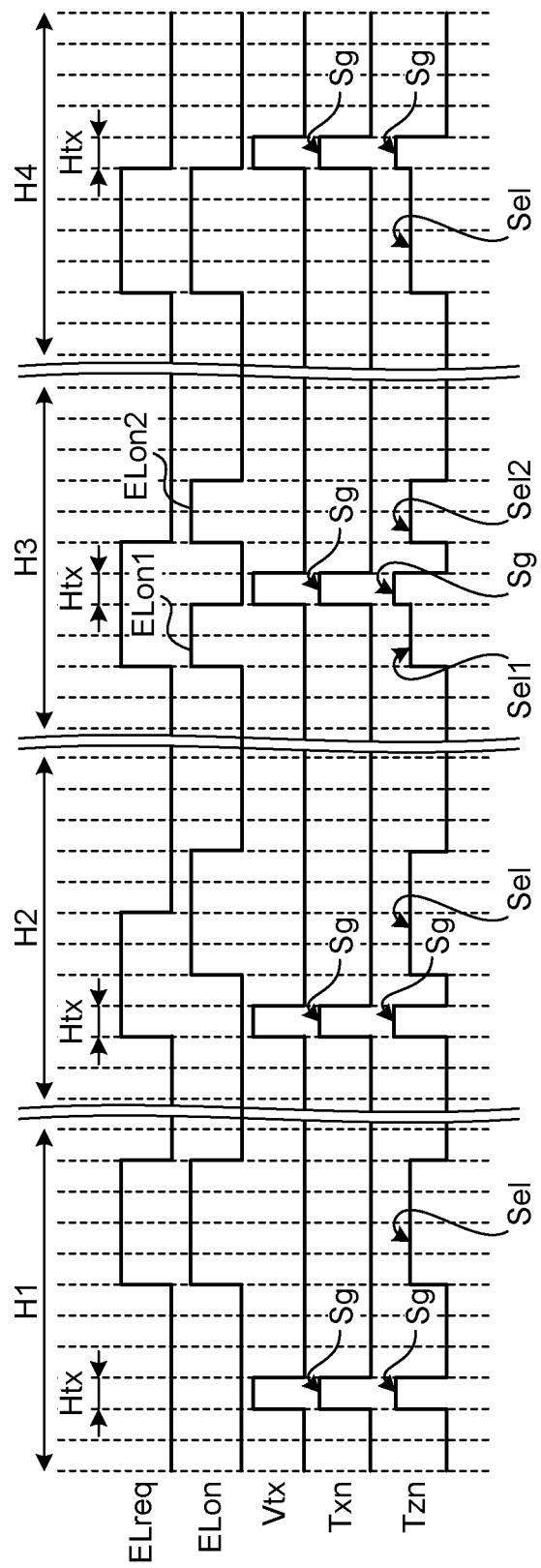
FIG. 22 is a timing chart of drive control according to a modification of the second embodiment.

The following describes drive control of the input device 2 according to a modification of the second embodiment with reference to FIGS. 1, 6, 7, and 20 to 22. In the following description, the input device 2 according to the modification of the second embodiment is explained using the input device 2 according to the first embodiment as an example. The technology according to the modification of the second embodiment is also applicable to any of the input devices described in the modifications of the first embodiment. FIG. 22 is a timing chart of drive control according to the modification of the second embodiment. Components identical with those described in the first embodiment, the second embodiment, and the modifications of the first embodiment are denoted by like reference numerals, and overlapping explanation thereof will be omitted.

As illustrated in FIG. 22, by performing the same drive control as that in the first period H1 described in the second embodiment, it is possible to carry out both lighting drive and proximity detection drive in the first period H1. Detailed description will be omitted for the drive control in the first period H1 performed by the input device 2 according to the modification of the second embodiment.

In the second period H2, the EL lighting timing generation circuit 18 replaces the pulse signal ELreq of the lighting period with a pulse signal ELon of the lighting period delayed by a period not coinciding with the drive signal Vtx (e.g., a period twice as long as the drive selection period Htx). The EL lighting timing generation circuit 18 then transmits the pulse signal ELon to the voltage control circuit 17. Based on the drive signal Vtx, the voltage control circuit 17 supplies the amplified drive signal pulse Sg to the drive electrode Tzn (a part of the second electrode unit 32) sequentially selected in the scanning direction Scan. Subsequently, the voltage control circuit 17 generates the lighting pulse Sel based on the pulse signal ELon of the lighting period. When the voltage control circuit 17 applies the lighting pulse Sel to a part of the second conductive layers (drive electrode Tzn) of the second electrode unit 32 of the input device 2, the first light-emitting element unit DEL emits light. In other words, the forward-bias light-emitting drive voltage ΔVFL is applied between the first electrode unit 31 and the second electrode unit 32 by the lighting pulse Sel, whereby the first light-emitting element unit DEL emits light.

In the second period H2, the first electrode driver 14 applies the drive signal pulse Sg to a part of the first conductive layers (drive electrode Txn) of the first electrode unit 31 in response to the drive signal Vtx. As described above, the second electrode driver 15 applies the drive signal pulse Sg to the second conductive layer (drive electrode Tzn) of the second electrode unit 32 overlapping with the drive electrode Txn in planar view in response to the drive signal Vtx. Even if the drive signal pulse Sg is applied in the drive selection period Htx, the potential difference between the first electrode unit 31 and the second electrode unit 32 is smaller than the light-emitting drive voltage ΔVFL at which the first light-emitting element unit DEL emits light. As a result, it is possible to suppress emission of light from the first light-emitting element unit DEL.

In the third period H3, the pulse signal ELreq of the lighting period is divided into a first pulse signal ELon1 of the lighting period and a second pulse signal ELon2 of the lighting period delayed by a period not coinciding with the drive signal Vtx (e.g., a period twice as long as the drive selection period Htx). The pulse signal ELreq of the lighting period is replaced by the first pulse signal ELon1 of the lighting period and the second pulse signal ELon2 of the lighting period. The voltage control circuit 17 generates a first lighting pulse Sel1 corresponding to the first pulse signal ELon1 of the lighting period. Based on the drive signal Vtx, the voltage control circuit 17 supplies the amplified drive signal pulse Sg to the drive electrode Tzn (a part of the second electrode unit 32) sequentially selected in the scanning direction Scan. Subsequently, the voltage control circuit 17 generates a second lighting pulse Sel2 corresponding to the second pulse signal ELon2 of the lighting period. When the voltage control circuit 17 applies the first lighting pulse Sel1 and the second lighting pulse Sel2 to a part of the second conductive layers (drive electrode Tzn) of the second electrode unit 32 of the input device 2, the first light-emitting element unit DEL emits light. In other words, the forward-bias light-emitting drive voltage ΔVFL is applied between the first electrode unit 31 and the second electrode unit 32 by the first lighting pulse Sel1 and the second lighting pulse Sel2, whereby the first light-emitting element unit DEL emits light.

In the third period H3, the first electrode driver 14 applies the drive signal pulse Sg to a part of the first conductive layers (drive electrode Txn) of the first electrode unit 31 in response to the drive signal Vtx. As described above, the second electrode driver 15 applies the drive signal pulse Sg to the second conductive layer (drive electrode Tzn) of the second electrode unit 32 overlapping with the drive electrode Txn in planar view in response to the drive signal Vtx. Even if the drive signal pulse Sg is applied in the drive selection period Htx, the potential difference between the first electrode unit 31 and the second electrode unit 32 is smaller than the light-emitting drive voltage ΔVFL at which the first light-emitting element unit DEL emits light. As a result, it is possible to suppress emission of light from the first light-emitting element unit DEL.

As illustrated in FIG. 22, by performing the same drive control as that in the fourth period H4 described in the second embodiment, it is possible to carry out both lighting drive and proximity detection drive in the fourth period H4. Detailed description will be omitted for the drive control in the fourth period H4 performed by the input device 2 according to the modification of the second embodiment.

As described above, if the drive signal Vtx for generating the drive signal pulse Sg coincides with the request signal for the lighting pulse Sel (display synchronization signal Vp), the second electrode driver 15 divides the lighting pulse into a front part and a rear part. The second electrode driver 15 then applies the first lighting pulse Sel1 resulting from the division, the drive signal pulse Sg, and the second lighting pulse Sel2 resulting from the division in this order to the second electrode unit 32. When scanning the drive electrodes Tz in a time-division manner during a period of which lighting is being requested, the second electrode driver 15 gives priority to application of the drive signal pulse Sg over application of the lighting pulse Sel to delay the application of the lighting pulse Sel. With this configuration, the drive signal pulse Sg does not virtually coincide with the lighting pulse Sel. It is thus possible to carry out both drive of the drive electrodes Tx and emission of light from the first light-emitting element unit DEL.

In any of the first period H1, the second period H2, the third period H3, and the fourth period H4, the first electrode driver 14 and the second electrode driver 15 can supply the drive signal pulse Sg at a constant timing regardless of whether the first light-emitting element unit DEL is turned on or off. As a result, the accuracy of proximity detection performed by the input device 2 does not vary depending on whether the first light-emitting element unit DEL is turned on or off.

Described above is the case where the drive signal Vtx is applied to the drive electrodes Tx and the drive electrodes Tz as one pulse. Also in a case where the drive signal Vtx is applied as a plurality of pulses, it is possible to carry out both lighting drive and proximity detection drive in the first period H1, the second period H2, and the fourth period H4 by performing the same drive control in the first period H1, the second period H2, and the fourth period H4 as described in the modification of the second embodiment.

In the second embodiment and the modification thereof, the first electrode unit 31 serves as a cathode of the first light-emitting element unit DEL, and the second electrode unit 32 serves as an anode of the first light-emitting element unit DEL. Alternatively, the first electrode unit 31 may serve as an anode of the first light-emitting element unit DEL, and the second electrode unit 32 may serve as a cathode of the first light-emitting element unit DEL.

While exemplary embodiments of the present invention have been described, the embodiments are not intended to limit the invention. The contents disclosed in the embodiments are given by way of example only, and various changes can be made without departing from the spirit of the invention. Appropriate changes made without departing from the spirit of the invention naturally fall within the technical scope of the invention.

The luminescent layer 22, for example, is not limited to an organic layer and may be an inorganic layer. The luminescent layer may be light-emitting diodes. The luminescent layer 22 may be a layer obtained by vapor-depositing a plurality of layers to emit white light or a layer in which luminescent layers of R, G, and B are separately provided. In the case of the luminescent layer 22 in which a plurality of colors, such as R, G, and B, are arranged on a single plane to display white, light-emitting element units of the respective colors have different optimum current values. In a case where the current values are optimized by the light-emitting element units of the respective colors in the input device 2, the light-emitting element units of the same color are preferably arranged on a single conductive layer in the first electrode unit 31. This configuration can facilitate optimization of the current value.

The first conductive layers of the first electrode unit 31, the second conductive layers of the second electrode unit 32, and the third conductive layers of the third electrode unit each may be a single layer or a laminated body composed of a plurality of layers.

The input device 2 according to the first and the second embodiments and the modifications thereof is applicable to electronic apparatuses of various fields, such as television apparatuses, digital cameras, notebook personal computers, portable electronic apparatuses including mobile phones, and video cameras. In other words, the display device 1 with a proximity detecting function including the input device 2 according to the first and the second embodiments and the modifications thereof and the display unit 9 is applicable to electronic apparatuses of various fields that display video signals received from the outside or video signals generated inside thereof as an image or video.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The application is claimed as follows:

1. An input device comprising:
    a first substrate having a first surface and a second surface;
    a light-emitting element unit including
        a first electrode unit that is formed on a second surface side of the first substrate, that includes a plurality of first conductive layers formed in one layer,
        a second electrode unit that is formed on the second surface side in a layer different from the layer of the first electrode unit and including a plurality of second conductive layers each having a size overlapping with one of the first conductive layers in planar view,
        a plurality of luminescent layers electrically in contact with at least a part of the first electrode unit, each of the luminescent layers being provided between the first electrode unit and the second electrode unit and being electrically in contact with one of the first conductive layers and one of the second conductive layers overlapping with the first conductive layer in planar view, and
        a light-blocking unit made of a metal material having metallic luster, and provided closer to the first surface than the luminescent layer; and
    a third electrode unit that is formed on the second surface, that is insulated from the first conductive layers, and that serves as a proximity detection electrode to detect a change in an electric field between the first conductive layers and the third electrode unit depending on coordinates of a proximity object present at a position overlapping with the first surface in planar view and output a proximity detection signal,
    wherein the luminescent layers emit light in a direction away from the second surface without facing the first surface,
    wherein the first surface functions as a reference plane for input coordinates of the proximity object in a drive selection period when the electric field is generated between the first conductive layers and the third electrode unit by a first drive signal pulse being input to the first conductive layers and a second drive signal pulse being input to the second conductive layers, a first rising direction of the first drive signal pulse and a second rising direction of the second drive signal pulse being identical, and
    wherein a first potential difference between the first conductive layers and the second conductive layers in a non-drive selection period is same as a second potential difference between the first conductive layers and the second conductive layers in the drive selection period.

2. The input device according to claim 1, wherein the third electrode unit includes a plurality of third conductive layers formed in one layer different from the layer of the first conductive layers.

3. The input device according to claim 1, wherein
the first conductive layers have a shape continuously extending in one direction in planar view and are in contact with the luminescent layers along the shape of the first conductive layers, and
the light-emitting element unit is capable of emitting light along the shape of the first conductive layers.

4. The input device according to claim 1, wherein the luminescent layer is an organic luminescent layer.

5. The input device according to claim 1, further comprising: a cover substrate facing the first surface of the first substrate, wherein the third electrode unit is provided on the cover substrate.

6. A display device comprising:
an input device including:
a first substrate having a first surface and a second surface;
a light-emitting element unit including
a first electrode unit that is formed on a second surface side of the first substrate, that includes a plurality of first conductive layers formed in one layer,
a second electrode unit that is formed on the second surface side in a layer different from the layer of the first electrode unit and including a plurality of second conductive layers each having a size overlapping with one of the first conductive layers in planar view,
a plurality of luminescent layers electrically in contact with at least a part of the first electrode unit, each of the luminescent layers being provided between the first electrode unit and the second electrode unit and being electrically in contact with one of the first conductive layers and one of the second conductive layers overlapping with the first conductive layer in planar view, and
a light-blocking unit made of a metal material having metallic luster, and provided closer to the first surface than the luminescent layer; and
a third electrode unit that is formed on the second surface, that is insulated from the first conductive layers, and that serves as a proximity detection electrode to detect a change in an electric field between the first conductive layers and the third electrode unit depending on coordinates of a proximity object present at a position overlapping with the first surface in planar view and output a proximity detection signal; and
a display unit provided on the second surface of the input device and capable of displaying an image on the first surface thereof,
wherein the luminescent layers emit light in a direction away from the second surface without facing the first surface,
wherein the first surface functions as a reference plane for input coordinates of the proximity object in a drive selection period when the electric field is generated between the first conductive layers and the third electrode unit by a first drive signal pulse being input to the first conductive layers and a second drive signal pulse being input to the second conductive layers, a first rising direction of the first drive signal pulse and a second rising direction of the second drive signal pulse being identical, and,
wherein a first potential difference between the first conductive layers and the second conductive layers in a non-drive selection period is same as a second potential difference between the first conductive layers and the second conductive layers in the drive selection period.

7. An input device comprising:
a first substrate having a first surface and a second surface;
a light-emitting element unit including
a first electrode unit that is formed on a second surface side of the first substrate, that includes a plurality of first conductive layers formed in one layer,
a second electrode unit that is formed on the second surface side in a layer different from the layer of the first electrode unit, and that includes a plurality of second conductive layers each having a size overlapping with one of the first conductive layers in planar view,
a plurality of luminescent layers electrically in contact with at least a part of the first electrode unit, each of the luminescent layers being provided between the first electrode unit and the second electrode unit and being electrically in contact with one of the first conductive layers and one of the second conductive layers overlapping with the first conductive layer in planar view, and
a light-blocking unit made of a metal material having metallic luster, and provided closer to the first surface than the luminescent layer; and
a third electrode unit that is formed on the first surface, that is insulated from the first conductive layers, and that serves as a proximity detection electrode to detect a change in an electric field between the first conductive layers and the third electrode unit depending on coordinates of a proximity object present at a position overlapping with the first surface in planar view and output a proximity detection signal,
wherein the luminescent layers emit light in a direction away from the second surface without facing the first surface,
wherein the first surface functions as a reference plane for input coordinates of the proximity object in a drive selection period when the electric field is generated between the first conductive layers and the third electrode unit by a first drive signal pulse being input to the first conductive layers and a second drive signal pulse being input to the second conductive layers, a first rising direction of the first drive signal pulse and a second rising direction of the second drive signal pulse being identical, and
wherein a first potential difference between the first conductive layers and the second conductive layers in a non-drive selection period is same as a second potential difference between the first conductive layers and the second conductive layers in the drive selection period.

* * * * *